United States Patent
Choi et al.

(10) Patent No.: US 10,432,768 B2
(45) Date of Patent: Oct. 1, 2019

(54) ELECTRONIC DEVICE WITH WATERPROOF STRUCTURE

(71) Applicant: Samsung Electronics Co., Ltd., Gyeonggi-do (KR)

(72) Inventors: Byounghee Choi, Gyeonggi-do (KR); Jihyun Kim, Gyeonggi-do (KR); Minsung Lee, Gyeonggi-do (KR); Jinho Lee, Gyeonggi-do (KR); Youngsoo Jang, Gyeonggi-do (KR); Yunsung Ha, Gyeonggi-do (KR); Yongwook Hwang, Gyeonggi-do (KR); Junghyeon Hwang, Gyeonggi-do (KR); Changyoun Hwang, Gyeonggi-do (KR); Minwoo Yoo, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 16/249,498

(22) Filed: Jan. 16, 2019

(65) Prior Publication Data
US 2019/0222683 A1 Jul. 18, 2019

(30) Foreign Application Priority Data
Jan. 16, 2018 (KR) .................. 10-2018-0005557

(51) Int. Cl.
*H04M 1/18* (2006.01)
*H04Q 1/24* (2006.01)
(Continued)

(52) U.S. Cl.
CPC ............ *H04M 1/18* (2013.01); *G06F 1/1626* (2013.01); *G06F 1/1656* (2013.01); *H01Q 1/243* (2013.01);
(Continued)

(58) Field of Classification Search
CPC .... H04M 1/18; H04M 1/0249; H04M 1/0252; H04M 1/23; H04M 1/026; H04M 1/02;
(Continued)

(56) References Cited

U.S. PATENT DOCUMENTS 9,680,206 B2 * 6/2017 Youn et al. .............. H04Q 1/44
9,699,279 B2 * 7/2017 Lee et al. ............ H04M 1/0202
(Continued)

FOREIGN PATENT DOCUMENTS

| CN | 107426369 | 12/2017 |
|---|---|---|
| KR | 10-1453067 | 10/2014 |

(Continued)

OTHER PUBLICATIONS

International Search Report dated Apr. 25, 2019 issued in counterpart application No. PCT/KR2019/000604, 6 pages.
European Search Report dated Jun. 6, 2019 issued in counterpart application No. 19152092.3-1221, 9 pages.

*Primary Examiner* — Meless N Zewdu
(74) *Attorney, Agent, or Firm* — The Farrell Law Firm, P.C.

(57) ABSTRACT

An electronic device is provided. The electronic device includes a frame structure, and the frame structure includes an outer metallic portion including a first metallic material and forming at least a portion of an outer surface of the electronic device, and an inner metallic portion including a second metallic material different from the first metallic material and laterally surrounded by the outer metallic portion, and a first inner polymeric portion isolated from the inner metallic portion and at least partially laterally surrounded by the outer metallic portion. The electronic device includes a wireless communication circuit electrically connected to a portion of the outer metallic portion.

20 Claims, 18 Drawing Sheets

(51) Int. Cl.
  *H05K 5/02* (2006.01)
  *G06F 1/16* (2006.01)
  *H04M 1/02* (2006.01)
  *H04B 1/3888* (2015.01)
  *H05K 5/00* (2006.01)
  *H01Q 1/24* (2006.01)

(52) U.S. Cl.
  CPC ........ *H04B 1/3888* (2013.01); *H04M 1/0249* (2013.01); *H05K 5/0086* (2013.01); *H05K 5/0247* (2013.01)

(58) Field of Classification Search
  CPC .... H04M 1/0283; H04M 1/185; H04M 1/035; H01Q 1/24; H05K 5/00; H05K 5/02; H04W 88/02; G06F 1/1601; G06F 1/16; H04B 2001/3894; H04B 1/3888; H04B 1/03; H04B 1/3827; H04B 1/3833
  See application file for complete search history.

(56) References Cited

U.S. PATENT DOCUMENTS

| | | | |
|---|---|---|---|
| 10,003,679 B2 * | 6/2018 | Lee et al. | H04M 1/0202 |
| 10,164,323 B2 | 12/2018 | Kwon et al. | |
| 2015/0155614 A1 * | 6/2015 | Youn et al. | H04Q 1/243 |
| 2016/0187925 A1 | 6/2016 | Yang et al. | |
| 2017/0111077 A1 | 4/2017 | Hwang et al. | |
| 2017/0135239 A1 | 5/2017 | Hyun et al. | |
| 2017/0294932 A1 | 10/2017 | Kang et al. | |
| 2019/0070760 A1 | 3/2019 | Huang et al. | |
| 2019/0104211 A1 * | 4/2019 | Shin et al. | H04M 1/0264 |

FOREIGN PATENT DOCUMENTS

| | | |
|---|---|---|
| KR | 10-1609528 | 4/2016 |
| KR | 1020170044527 | 4/2017 |
| KR | 1020170092794 | 8/2017 |
| WO | WO 2017/122877 | 7/2017 |
| WO | WO 2017/135667 | 8/2017 |

\* cited by examiner

ELECTRONIC DEVICE WITH WATERPROOF STRUCTURE

CROSS-REFERENCE TO RELATED APPLICATION(S)

This application is based on and claims priority under 35 U.S.C. § 119 to Korean Patent Application Serial No. 10-2018-0005557, filed on Jan. 16, 2018, in the Korean Intellectual Property Office, the entire disclosure of which is incorporated herein by reference.

BACKGROUND

1. Field

The present disclosure relates generally to an electronic device with a waterproof structure.

2. Description of Related Art

With the growth of digital technologies, an electronic device is being provided in various forms such as a smart phone, a tablet personal computer (PC), a personal digital assistant (PDA), etc. The electronic device is being developed even in a form of being wearable on a user to improve portability and user accessibility.

An appearance of the electronic device may have a metallic member and a nonmetallic member. The electronic device including the metallic member can provide a luxurious design peculiar to a metal. Because a metallic material included in the metallic member affects durability, the electronic device employing the metallic member attracts more attention.

To support electronic parts, the electronic device can include an internal support member disposed inside the metallic member. The internal support member can have the same metallic material and can be formed to have a metallic structure integral with the metallic member. However, an interface between this metallic structure and a nonmetallic member can be separated by a shock caused by falling, etc. Due to this, foreign materials, such as water, can be introduced inside the electronic device via a gap between the metallic structure and the nonmetallic member. Also, the metallic structure can be formed of the metallic material which is focused on a design beauty of the metallic member. The internal support member including the metallic material can increase a weight of the electronic device. Besides this, this metallic material may not satisfy various conditions such as thermal conductive characteristics, electrical conductive characteristics, etc. required for the electronic device compared to other metallic materials

SUMMARY

The present disclosure has been made to address at least the disadvantages described above and to provide at least the advantages described below.

In accordance with an aspect of the present disclosure, an electronic device is provided. The electronic device includes a frame structure, and the frame structure includes an outer metallic portion including a first metallic material and forming at least a portion of an outer surface of the electronic device, and an inner metallic portion including a second metallic material different from the first metallic material and laterally surrounded by the outer metallic portion, and a first inner polymeric portion isolated from the inner metallic portion and at least partially laterally surrounded by the outer metallic portion. The electronic device includes a wireless communication circuit electrically connected to a portion of the outer metallic portion.

BRIEF DESCRIPTION OF THE DRAWINGS

The above and other aspects, features and advantages of certain embodiments of the disclosure will be more apparent from the following detailed description taken in conjunction with the accompanying drawings, in which.

DETAILED DESCRIPTION

Figure 1A:
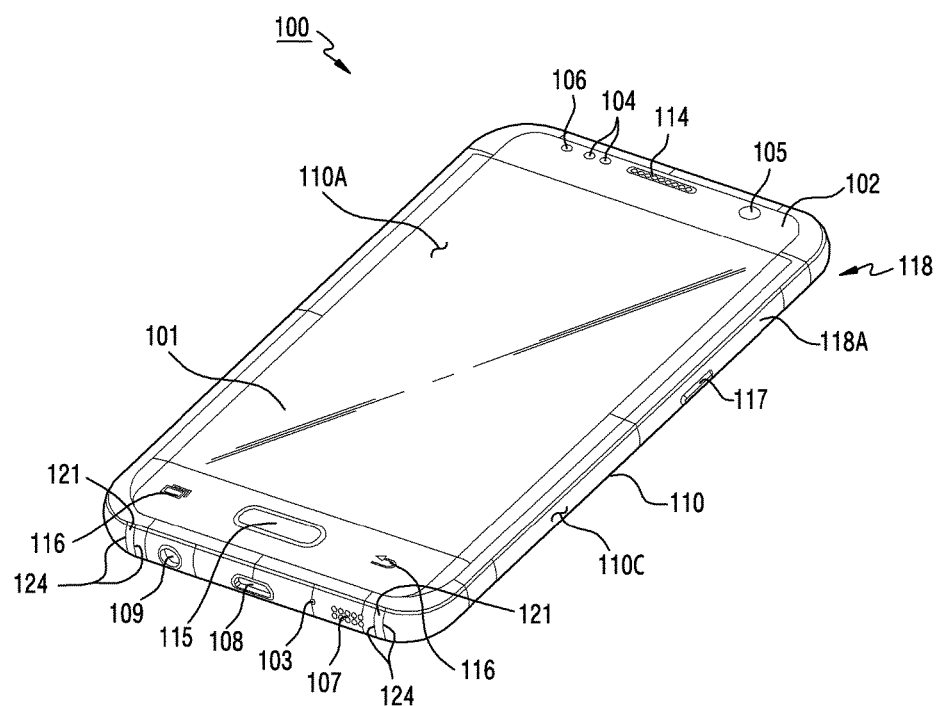
FIG. 1A is a diagram of a front surface of an electronic device with a waterproof structure, according to an embodiment.

Embodiments of the disclosure will be described herein below with reference to the accompanying drawings. However, the embodiments of the disclosure are not limited to the specific embodiments and should be construed as including all modifications, changes, equivalent devices and methods, and/or alternative embodiments of the present disclosure. In the description of the drawings, similar reference numerals are used for similar elements.

The terms "have," "may have," "include," and "may include" as used herein indicate the presence of corresponding features (for example, elements such as numerical values, functions, operations, or parts), and do not preclude the presence of additional features.

It will be understood that, when an element (for example, a first element) is "(operatively or communicatively) coupled with/to" or "connected to" another element (for example, a second element), the element may be directly coupled with/to another element, and there may be an intervening element (for example, a third element) between the element and another element. To the contrary, it will be understood that, when an element (for example, a first element) is "directly coupled with/to" or "directly connected to" another element (for example, a second element), there is no intervening element (for example, a third element) between the element and another element.

The expression "configured to (or set to)" as used herein may be used interchangeably with "suitable for," "having the capacity to," "designed to," "adapted to," "made to," or "capable of" according to a context. The term "configured to (set to)" does not necessarily mean "specifically designed to" in a hardware level. Instead, the expression "apparatus configured to . . . " may mean that the apparatus is "capable of . . . " along with other devices or parts in a certain context.

For example, "a processor configured to (set to) perform A, B, and C" may mean a dedicated processor (e.g., an embedded processor) for performing a corresponding operation, or a generic-purpose processor (e.g., a central processing unit (CPU) or an application processor (AP)) capable of performing a corresponding operation by executing one or more software programs stored in a memory device.

The terms used in describing the various embodiments of the disclosure are for the purpose of describing particular embodiments and are not intended to limit the disclosure. As used herein, the singular forms are intended to include the plural forms as well, unless the context clearly indicates otherwise. All of the terms used herein including technical or scientific terms have the same meanings as those generally understood by an ordinary skilled person in the related art unless they are defined otherwise. Terms defined in a generally used dictionary should be interpreted as having the same or similar meanings as the contextual meanings of the relevant technology and should not be interpreted as having ideal or exaggerated meanings unless they are clearly defined herein. According to circumstances, even the terms defined in this disclosure should not be interpreted as excluding the embodiments of the disclosure.

An electronic device according to the disclosure may include at least one of, for example, a smart phone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a MPEG-1 audio layer-3 (MP3) player, a mobile medical device, a camera, and a wearable device. The wearable device may include at least one of an accessory type (e.g., a watch, a ring, a bracelet, an anklet, a necklace, a glasses, a contact lens, or a head-mounted device (HMD)), a fabric or clothing integrated type (e.g., an electronic clothing), a body-mounted type (e.g., a skin pad, or tattoo), and a bio-implantable type (e.g., an implantable circuit).

The electronic device may be a home appliance. The home appliance may include at least one of, for example, a television, a digital video disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

The electronic device may include at least one of various medical devices (e.g., various portable medical measuring devices (a blood glucose monitoring device, a heart rate monitoring device, a blood pressure measuring device, a body temperature measuring device, etc.), a magnetic resonance angiography (MRA), a magnetic resonance imaging (MRI), a computed tomography (CT) machine, and an ultrasonic machine), a navigation device, a global positioning system (GPS) receiver, an event data recorder (EDR), a flight data recorder (FDR), a vehicle infotainment device, an electronic device for a ship (e.g., a navigation device for a ship, and a gyro-compass), avionics, security devices, an automotive head unit, a robot for home or industry, an automatic teller machine (ATM) in banks, point of sales (POS) devices in a shop, or an Internet of things (IoT) device (e.g., a light bulb, various sensors, electric or gas meter, a sprinkler device, a fire alarm, a thermostat, a streetlamp, a toaster, a sporting goods, a hot water tank, a heater, a boiler, etc.).

The electronic device may include at least one of a part of furniture or a building/structure, an electronic board, an electronic signature receiving device, a projector, and various kinds of measuring instruments (e.g., a water meter, an electric meter, a gas meter, and a radio wave meter). The electronic device may be a combination of one or more of the aforementioned various devices. The electronic device may also be a flexible device. Further, the electronic device is not limited to the aforementioned devices, and may include an electronic device according to the development of new technology.

Hereinafter, an electronic device will be described with reference to the accompanying drawings. In the disclosure, the term "user" indicates a person using an electronic device or a device (e.g., an artificial intelligence electronic device) using an electronic device.

Figure 1B:
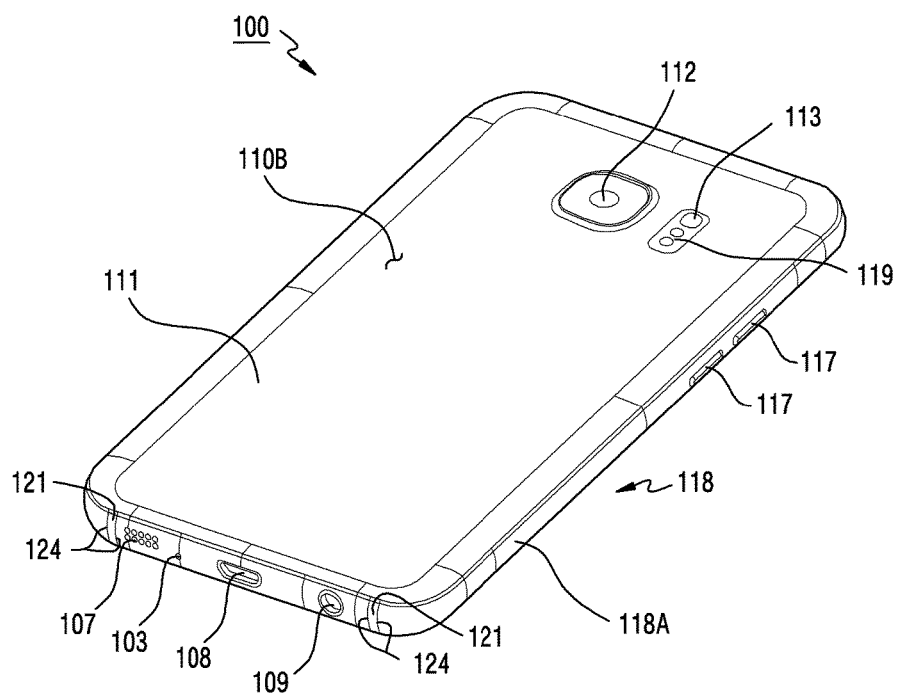
FIG. 1B is a diagram of a rear surface of the electronic device with the waterproof structure of FIG. 1A, according to an embodiment.
Figure 2:
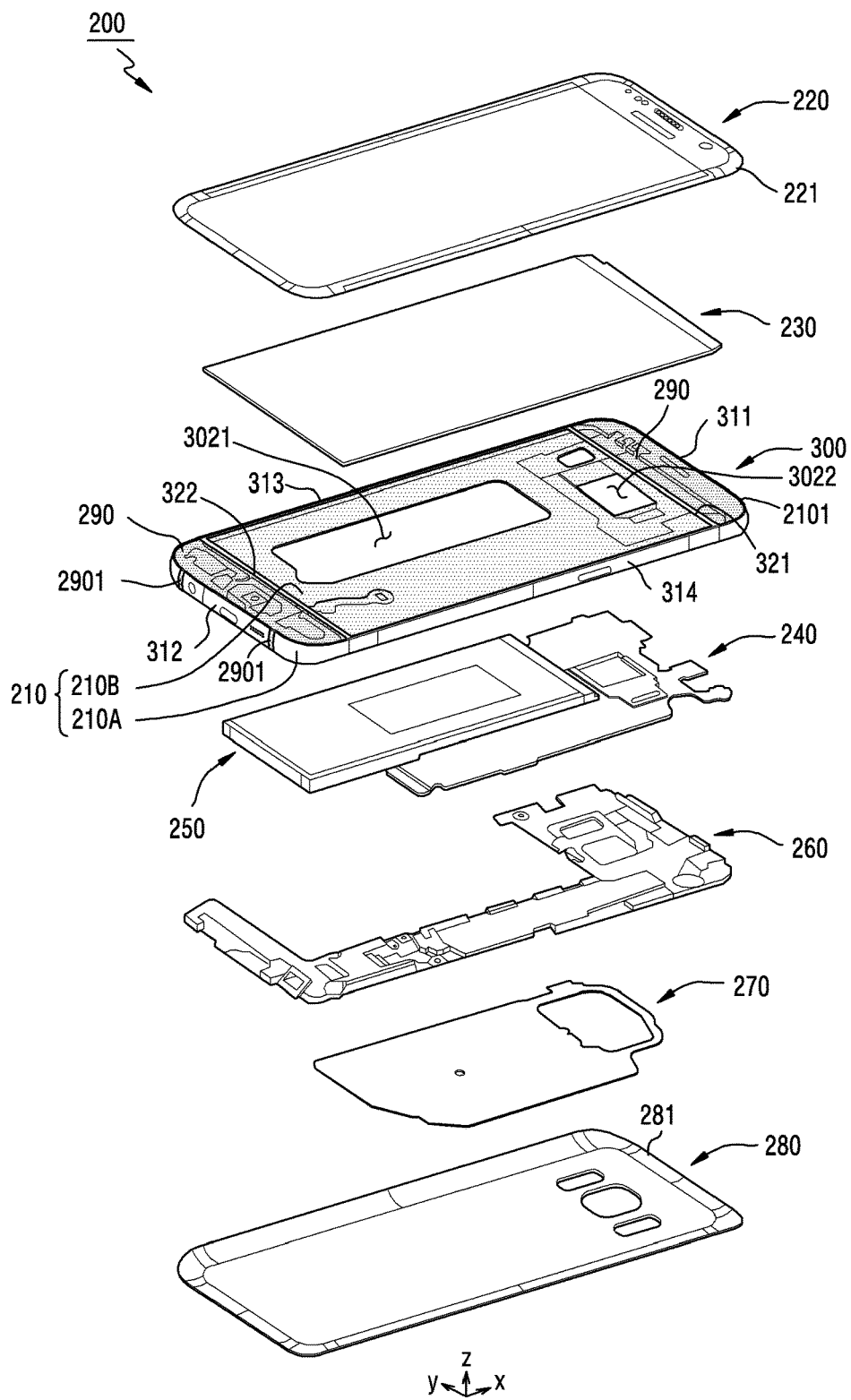
FIG. 2 is diagram of an electronic device with a waterproof structure, according to an embodiment.
Figure 3:
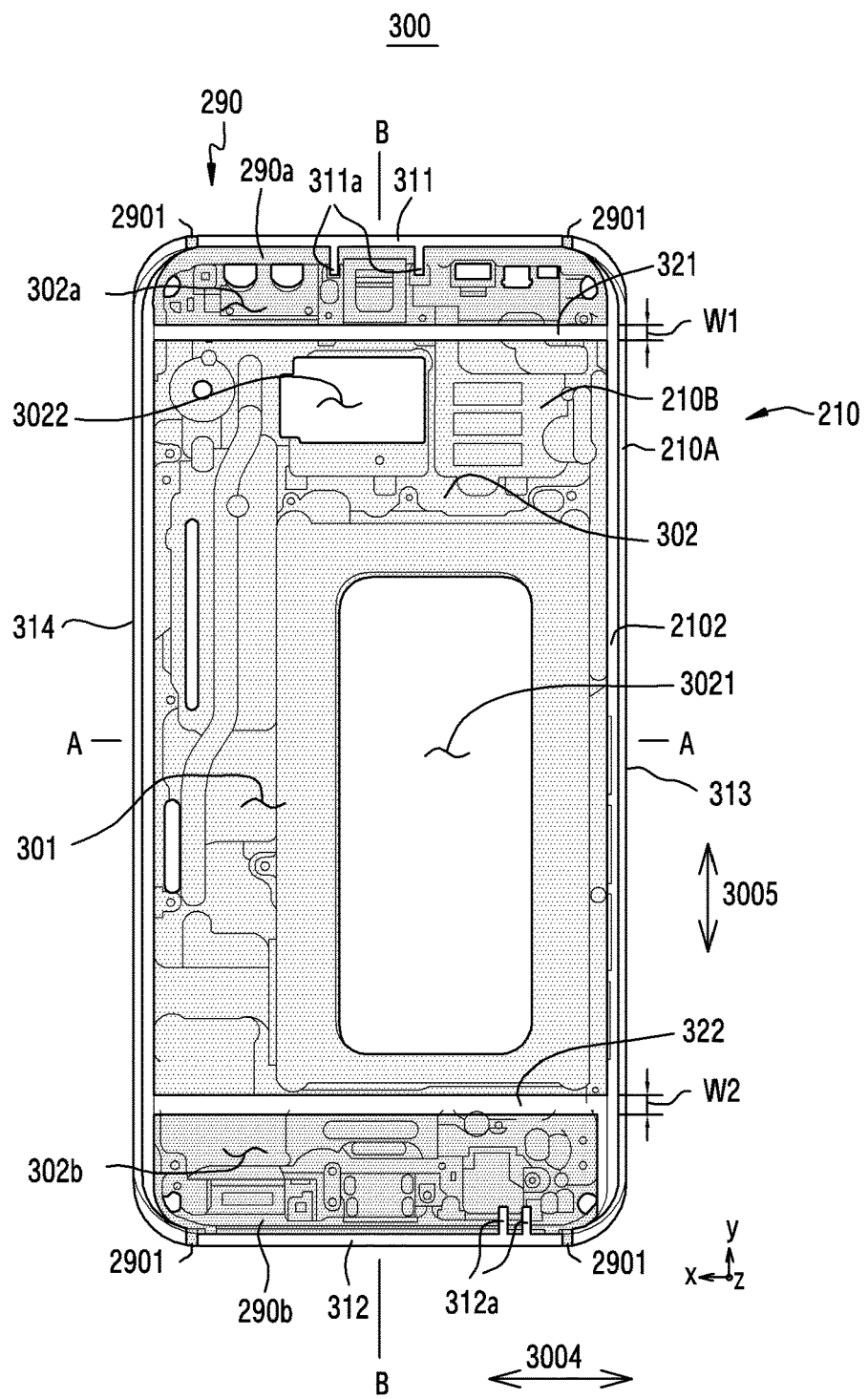
FIG. 3 is a diagram of a first support member, according to an embodiment.

FIG. 1A is a diagram of a front surface of an electronic device with a waterproof structure, according to an embodiment. FIG. 1B is a diagram of a rear surface of the electronic device with the waterproof structure of FIG. 1A. FIG. 2 is a diagram of the electronic device with the waterproof structure, according to an embodiment. FIG. 3 is a diagram of a support member, according to an embodiment.

Referring to FIGS. 1A and 1B, according to an embodiment, the electronic device 100 may include a housing 110 which includes a first surface (or front surface) 110A, a second surface (or rear surface) 110B, and a side surface 110C surrounding a space between the first surface 110A and the second surface 110B. The housing may denote a structure forming some of the first surface 110A, the second surface 110B and the side surface 110C of FIG. 1A as well. The first surface 110A may be formed by a first plate (a front plate) 102 (e.g., a glass plate including various coating layers, or a polymer plate) with at least portion being substantially transparent. The second surface 110B may be formed by a second plate (a rear plate) 111 facing away from the first plate 102. The rear plate 111 may be a glass plate. The rear plate 111 may be formed substantially opaquely, and may be formed of a coated or colored glass, a ceramic, polymer, a metal (e.g., aluminum (Al), a steel type stainless (STS) or magnesium (Mg)), or a combination of at least two of the materials. The side surface 110C may be formed by a frame structure 118 which is combined with the front plate 102 and the rear plate 111 and includes a metal and/or polymer. The rear plate 111 and the frame structure 118 may be integrally formed and may include the same material (e.g., a metallic material such as Al).

According to an embodiment, the frame structure 118 may include an outer metallic portion 118A formed of a first metallic material, and an inner metallic portion formed of a second metallic material different from the first metallic material. The outer metallic portion 118a may form the side surface 110C. The front plate 102 and the rear plate 111 may be combined to both sides of the outer metallic portion 118A, respectively. The inner metallic portion of the frame structure 118 may be combined to the outer metallic portion 118A of the frame structure 118, and may be disposed in a space between the front plate 102 and the rear plate 111.

According to an embodiment, the frame structure 118 may include at least one inner nonmetallic portion of a nonmetallic material which is disposed in a space between the front plate 102 and the rear plate 111 and is combined to the outer metallic portion 118A. The inner nonmetallic portion (inner polymeric portion) formed of polymer may be isolated from the inner metallic portion and may be at least partially surrounded by the outer metallic portion 118A.

According to an embodiment, the outer metallic portion 118A may include at least one first space portion in which the inner metallic portion is combined, and at least one second space portion in which the inner nonmetallic portion is combined. The outer metallic portion 118A may include one or more portions (portioning portions or dividers) isolating the first space portion and the second space portion. The first space portion may be defined as a space or region which is limited by a portion of the outer metallic portion 118A and at least one portioning portion. The second space portion may be defined as a space or region which is limited by another portion of the outer metallic portion 118A and at least one portioning portion.

According to an embodiment, to decrease a deterioration of a radio wave radiation performance of the electronic device 100 caused by the frame structure 118, the frame structure 118 may be designed to have a structure in which a portion of the frame structure 118 is physically or electrically isolated from the remaining portion of the frame structure 118. The inner nonmetallic portion may get a portion of the outer metallic portion 118A maintained in a state of being physically or electrically isolated from the remaining portion of the frame structure 118. A portion 121 of the inner nonmetallic portion may be disposed in gaps of the outer metallic portion 118A and form a portion of the side surface 110C of the electronic device 100.

According to an embodiment, the electronic device 100 may include at least one or more of a display 101, audio modules 103, 107 and 114, sensor modules 104 and 119, camera modules 105, 112 and 113, key input devices 115, 116 and 117, an indicator 106 or connector holes 108 and 109. The electronic device 100 may omit at least one (e.g., the key input devices 115, 116 and 117 or the indicator 106) of the components, or may additionally include another component.

For example, the display 101 may be exposed through a large portion of the front plate 102. The display 101 may be combined with or be disposed adjacent with a touch sensing circuit, a pressure sensor capable of measuring a touch strength (pressure), and/or a digitizer capable of detecting a magnetic-type stylus pen.

The audio modules 103, 107 and 114 may include a microphone hole 103 and speaker holes 107 and 114. A microphone for obtaining an external sound may be disposed within the microphone hole 103. According to various embodiments, a plurality of microphones may be disposed within the microphone hole 103 and sense a direction of sound. According to various embodiments, the speaker holes 107 and 114 may include an external speaker hole 107 and a call receiver hole 114. The speaker holes 107 and 114 and the microphone hole 103 may be implemented as one hole, or a speaker (e.g., a piezo speaker) may be implemented without the speaker holes 107 and 114.

According to an embodiment, the sensor modules 104 and 119 may provide an electric signal or data value corresponding to an operational state of the electronic device 100 or an environmental state external to the electronic device 101. The sensor modules 104 and 119 may, for example, include a first sensor module 104 (e.g., a proximity sensor) and/or a second sensor module (e.g., a fingerprint scanning sensor) that are disposed in the first surface 110A of the housing 110, and/or a third sensor module 119 (e.g., a heart rate monitor (HRM) sensor) that is disposed in the second surface 110B of the housing 110. The fingerprint scanning sensor may be disposed in the second surface 110B as well as the first surface 110A (e.g., the home key button 115). The electronic device 100 may further include at least one of non-shown sensor modules, such as a gesture sensor, a gyro sensor, a barometer, a magnetic sensor, an acceleration sensor, a grip sensor, a color sensor, an infrared (IR) sensor, a biometric sensor, a temperature sensor, a humidity sensor, or an illuminance sensor.

According to an embodiment, the camera modules 105, 112 and 113 may include a first camera device 105 disposed in the first surface 110A of the electronic device 100, and a second camera device 112 disposed in the second surface 110B, and/or a flash 113. The camera modules 105 and 112 may include one or a plurality of lenses, an image sensor, and/or an image signal processor. The flash 113 may, for example, include a light emitting diode or a xenon lamp. Two or more lenses (e.g., wide-angle and telephoto lenses) and image sensors may be disposed in one surface of the electronic device 100.

According to an embodiment, the key input devices 115, 116 and 117 may include a home key button 115 disposed in the first surface 110A of the housing 110, a touch pad 116 disposed around the home key button 115, and/or a side key button 117 disposed in the side surface 110C of the housing 110. According to various embodiments, the electronic device 100 may not include some or all of the above-mentioned key input devices 115, 116 and 117. The key input devices 115, 116 and 117 not included may be implemented in another form such as a soft key on the display 101.

For example, the indicator 106 may be disposed in the first surface 110A of the housing 110. The indicator 106 may provide state information of the electronic device 100 in the form of light, and may include an LED.

For example, the connector holes 108 and 109 may include a first connector hole 108 capable of accepting a connector (e.g., a universal serial bus (USB) connector) for transmitting and/or receiving power and/or data with an external electronic device, and/or a second connector hole (e.g., an earphone jack) 109 capable of accepting a connector for transmitting and/receiving an audio signal with the external electronic device.

Referring to FIG. 2, according to an embodiment, the electronic device 200 may include a first support member (e.g., the frame structure 118 of FIG. 1A or 1B) including a metallic portion 210 and an inner nonmetallic portion 290, a front plate 220, a display 230, a printed circuit board 240, a battery 250, a second support member 260 (e.g., a rear case), an antenna 270, and a rear plate 280. The electronic device 200 may omit at least one (e.g., the second support member 260) of the components or additionally include another component. According to various embodiments, at least one of the components of the electronic device 200 may be identical or similar with at least one of the components of the electronic device 100 of FIG. 1A or FIG. 1B, and a repeated description is omitted below.

Referring to FIGS. 2 and 3, according to an embodiment, the metallic portion 210 may include an outer metallic portion 210A, and an inner metallic portion 210B formed of a metallic material different from that of the outer metallic portion 210A. The outer metallic portion 210A may be of a form surrounding a space between the front plate 220 and the rear plate 280. The inner metallic portion 210B may be combined to the outer metallic portion 210A and be disposed in the space between the front plate 220 and the rear plate 280. The inner metallic portion 210B may be laterally surrounded by the outer metallic portion 210A. The inner metallic portion 210B may be combined to an opening of the outer metallic portion 210A. An inner surface of the opening is provided along a lateral surface (or side surface) of the inner metallic portion 210B and be combined to the lateral surface of the inner metallic portion 210B.

According to an embodiment, a second metallic material forming the inner metallic portion 210B may have at least one substance characteristic (e.g., a thermal conduction rate, an electrical conduction rate, a specific gravity, a corrosion resistance, etc.) different from that of a first metallic material forming the outer metallic portion 210A. The second metallic material may have a melting point not greater than that of the first metallic material. The second metallic material may have a specific gravity not greater than that of the first metallic material. The second metallic material may have a thermal conduction rate or electrical conduction rate different from that of the first metallic material. The first metallic material may provide a stronger gloss than the second metallic material. The outer metallic portion 210A formed of the first metallic material may have designing aesthetic characteristics. According to various embodiments, the first metallic material and the second metallic material may provide mutually different mechanical strengths (e.g., tensile strengths, flexural strengths, shear strengths, fatigue strengths, etc.).

According to an embodiment, the outer metallic portion 210A may include titanium (Ti), an amorphous alloy, a ceramic substance, a stainless steel, a steel use stainless (SUS) or the like. And, the inner metallic portion 210B may include magnesium (Mg), a magnesium alloy, Al, an aluminum alloy, zinc (Zn), a zinc alloy, copper (Cu), a copper alloy or the like.

According to an embodiment, a first junction layer for combination of heterogeneous metals may be interposed in a first interface between the outer metallic portion 210A and the inner metallic portion 210B. The outer metallic portion 210A formed of the first metallic material may be coated with a material of the first junction layer and, through die casting, the inner metallic portion 210B of the second metallic material may be formed. The first junction layer may be a material that reacts to heat or pressure generated while the inner metallic portion 210B combined to the outer metallic portion 210A is formed. The material of the first junction layer may react to heat or pressure, to be tightly combined to the outer metallic portion 210A and the inner metallic portion 210B. While the inner metallic portion 210B is formed, the material of the first junction layer may be fused to the outer metallic portion 210A. In response to the second metallic material of a melted state being injected into a mold in which the outer metallic portion 210A coated with the material of the first junction layer is disposed, a fusion layer between the material of the first junction layer and the second metallic material may be formed.

According to an embodiment, the first junction layer may include a material capable of increasing a bonding force between the outer metallic portion 210A and the inner metallic portion 210B formed of mutually different metallic materials, and may be strongly joined to all of the outer metallic portion 210A and the inner metallic portion 210B. The first junction layer may be chosen as a material capable of increasing all of an interfacial bonding force between the first junction layer and the outer metallic portion 210A, and an interfacial bonding force between the first junction layer and the inner metallic portion 210B. The interfacial bonding force may be defined as a mechanical strength indicating resistance to damage by an external force, or an environmental strength indicating resistance to damage by the environment (e.g., water, heat, etc.).

According to an embodiment, the first junction layer may include a material having a lower melting point than the first metallic material of the outer metallic portion 210A or the second metallic material of the inner metallic portion 210B.

According to an embodiment, the first junction layer may include a low-melting-point compound. The first junction layer may be a plating layer. The plating layer may be formed on the outer structure 210A in various plating schemes. The first junction layer may be designed as a metallic layer formed of other various different metallic materials.

According to an embodiment, the metallic portion 210 may include a portion 2101 to which an edge region 221 of the front plate 220 is combined and a portion 2102 to which an edge region 281 of the rear plate 280 is combined. The front plate 220 and the rear plate 280 may be combined to the metallic portion 210 by using an adhesive material such as a double-sided tape.

According to an embodiment, the inner nonmetallic portion 290 may be combined to the outer metallic portion 210A, and may be disposed in a space between the front plate 220 and the rear plate 280. The inner nonmetallic portion 290 may be physically isolated from the inner metallic portion 210B and may be at least partially laterally surrounded by the outer metallic portion 210A. The inner nonmetallic portion 290 may be combined to an opening of the outer metallic portion 210A. An inner surface of the opening is provided along at least a portion of a lateral surface (or side surface) of the inner nonmetallic portion 290 and may be combined to the lateral surface of the inner nonmetallic portion 290.

According to an embodiment, a second junction layer may be interposed in a second interface between the outer metallic portion 210A and the inner nonmetallic portion 290. The outer metallic portion 210A formed of the first metallic material may be coated with a material (e.g., organic junction layer) of the second junction layer and, through injection, the inner nonmetallic portion 290 may be formed. The second junction layer may be a material that reacts to heat or pressure generated while the inner nonmetallic portion 290 combined to the outer metallic portion 210A is formed. The material of the second junction layer may react to heat or pressure, to be tightly combined to the outer metallic portion 210A and the inner nonmetallic portion 290.

According to an embodiment, a bonding force of the first interface between the outer metallic portion 210A and the inner metallic portion 210B, and a bonding force (or junction force) of the second interface (e.g., the interface 124 of FIGS. 1A and 1B) between the outer metallic portion 210A and the inner nonmetallic portion 290 may be maintained against a shock generated in such a condition as when the electronic device 200 is fallen.

According to an embodiment, the first junction layer may be a material that does not react to heat or pressure generated while the inner nonmetallic portion 290 combined to the outer metallic portion 210A is formed. Due to this, while the inner nonmetallic portion 290 combined to the outer metallic portion 210A is formed, the first junction layer may be maintained in a state of being tightly combined to the outer metallic portion 210A and the inner metallic portion 210B.

According to an embodiment, the outer metallic portion 210A may include at least one first space portion in which the inner metallic portion 210B is combined, and at least one second space portion in which the inner nonmetallic portion 290 is combined. The outer metallic portion 210A may include one or more portioning portions isolating the first space portion and the second space portion. The outer metallic portion 210A may be a rectangular ring shaped structure including a first frame 311, a second frame 312, a third frame 313 and a fourth frame 314. The outer metallic portion 210A may include a first portioning portion 321 and a second portioning portion 322 which connect the third frame 313 and the fourth frame 314. The first portioning portion 321 and the second portioning portion 322 may be of a straight-line form of being extended in a direction (a fourth direction) 3004 between the third frame 313 and the fourth frame 314. The first portioning portion 321 and the second portioning portion 322 may be in parallel to each other. A width (W1) of the first portioning portion 321 and a width (W2) of the second portioning portion 322 in a direction (a fifth direction 3005) between the first frame 311 and the second frame 312 may be designed mutually identically or differently. The first space portion 301 in which the inner metallic portion 210B is combined may be a space that is limited by a portion of the third frame 313, a portion of the fourth frame 314, the first portioning portion 321 and the second portioning portion 322. The one second space portion 302a in which the inner nonmetallic portion 290 is combined may be a space that is limited by the first frame 311, a portion of the third frame 313, a portion of the fourth frame 314 and the first portioning portion 321. The other second space portion 302a in which the inner nonmetallic portion 290 is combined may be a space that is limited by the second frame 312, a portion of the third frame 313, a portion of the fourth frame 314 and the second portioning portion 322. When viewed from above the front plate 220, the first space portion 301 may be disposed between the second space portions 302a and 302b and may be generally rectangular. The inner nonmetallic portion 290 may include a first inner polymeric portion 290a disposed in the one second space portion 302a, and a second inner polymeric portion 290b disposed in the other second space portion 302b. When viewed from above the front plate 220, the inner metallic portion 210B may be disposed between the first inner polymeric portion 290a and the second inner polymeric portion 290b.

According to an embodiment, the first portioning portion 321 and the second portioning portion 322 may increase a torsional rigidity or durability of the first support member 300.

According to various embodiments, the first portioning portion 321 or the second portioning portion 322 may be designed in various different forms. The width (W1) of the first portioning portion 321 or the width (W2) of the second portioning portion 322 may be designed to be constant or inconstant along the fourth direction 3004. When viewed from an x-y section, an x-z section or a y-z section, the first portioning portion 321 or the second portioning portion 322 may have various sectional shapes.

According to various embodiments, the first portioning portion 321 and the second portioning portion 322 may be designed not parallel to each other as well.

According to various embodiments, a thickness of the first portioning portion 321 and a thickness of the second portioning portion 322 may be designed to be mutually identical or different in a direction (a third direction) 3003 between the front plate 220 and the rear plate 280. The thickness of the first portioning portion 321 or the thickness of the second portioning portion 322 may be designed to be constant or inconstant along the fourth direction 3004 as well.

According to various embodiments, the first portioning portion 321 or the second portioning portion 322 may be designed in various different forms, without being limited to the shown straight-line form. At least a portion of the first portioning portion 321 or second portioning portion 322 may be designed in a curved shape.

According to various embodiments, the outer metallic portion 210A may be designed to further include an additional portioning portion. The outer metallic portion 210A may be designed to further include a portioning portion that connects the first portioning portion 321 and the second portioning portion 322. The first space portion 301 in which the inner metallic portion 210B is combined may be divided into two space portions as well.

According to various embodiments, the outer metallic portion 210A may be designed to include one or more portioning portions that connect the first frame 311 and the second frame 312 as well.

According to various embodiments, the outer metallic portion 210A may be designed to include a plurality of portioning portions of a mutually intersected structure as well.

According to various embodiments, the outer metallic portion 210A may be designed to include at least one portioning portion that connects the first frame 311 and the third frame 312, the first frame 311 and the fourth frame 314, the second frame 312 and the third frame 313, or the second frame 312 and the fourth frame 314 as well.

According to various embodiments, the inner nonmetallic portion 290 may get a portion 311 or 312 of the outer metallic portion 210A maintained in a state of being physically or electrically isolated from the remaining portion of the metallic portion 210. This portion 311 or 312 of the outer metallic portion 210A will be denoted as a metal piece. A portion 2901 of the inner nonmetallic portion 290 may be designed as a protrusion portion that is extended to be disposed in a gap of the outer metallic portion 210A, and may be exposed outside. The metal pieces 311 and 312 of the outer metallic portion 210A may be electrically connected to the printed circuit board 240 and may be used as an antenna component. The portion 311 or 312 of the metallic portion 210 may be used as an antenna radiator or an antenna ground. The outer metallic portion 210A may include terminals 311a and 312a that are extended from the metal pieces 311 and 312 to cover the inner nonmetallic portion 290. These terminals 311a and 312a may be electrically connected with the printed circuit board 240. The metal pieces 311 and 312 of the outer metallic portion 210A may be designed to be in an electrical floating state as well. The printed circuit board 240 may be combined to the one surface of a mid-plate (or bracket) 302 defined as an inside portion of the outer metallic portion 210A among the first support member 300. The printed circuit board 240 may be disposed between the mid-plate 302 and the rear plate 280. An x-z section corresponding to an A-A portion of the first support member 300, or a y-z section corresponding to a B-B portion may be of an H shape. The mid-plate 302 may be surrounded by the outer metallic portion 210A. The display 230 may be combined to the other surface of the mid-plate 302, and may be disposed between the mid-plate 302 and the front plate 220. The printed circuit board 240 may mount electronic components such as a processor, a memory, an interface and/or the like. The processor may include one or more of a central processing device, an application processor, a graphic processing device, am image signal processor, a sensor hub processor, or a communication processor. The memory may include, for example, a volatile memory or a non-volatile memory. The interface may include, for example, a high definition multimedia interface (HDMI), a USB interface, a secure digital (SD) card interface, and/or an audio interface. The interface may electrically or physically connect the electronic device 200 with an external electronic device. The interface may include a USB connector, an SD card/MMC connector, or an audio connector.

According to an embodiment, the electronic component such as the processor, the battery 250, etc., may be disposed to be aligned in the inner metallic portion 210B. An electronic component having a relatively large heating value among a plurality of electronic components may be designed to be aligned in the inner metallic portion 210B.

According to an embodiment, the inner metallic portion 210B may include one or more openings 3021 and 3022. According to various embodiments, the openings 3021 and 3022 may be used to decrease a weight of the inner metallic portion 210B or mount the electronic component. One opening 3021 may be provided between the display 230 and the battery 250.

According to an embodiment, the battery 250 may be swelled up. This may cause an increase of a thickness of at least a portion of the battery 250. The opening 3021 may provide a space occupied by the portion of the battery 250 of which the thickness is increased due to the swelling. This opening 3021 may prevent the front plate 220 combined with the display 230 from being isolated from the first support member 300 because of the swelling of the battery 250 or prevent the display 230 and the front plate 220 from being damaged (e.g., being broken by a pressure transferred from the battery 250).

According to an embodiment, the battery 250, a device for supplying power to at least one component of the electronic device 200, may include a non-rechargeable primary cell, a rechargeable secondary cell or a fuel cell. At least a portion of the battery 250 may be disposed on the substantially same plane as the printed circuit board 240. The battery 250 may be disposed integrally within the electronic device 100, and may be disposed detachably with the electronic device 200 as well.

According to an embodiment, the second support member 260 may be combined to the first support member 300, and may be disposed between the printed circuit board 240 and the rear plate 280. The second support member 260 may be combined to the first support member 300 by using bolt connection, etc. together with the printed circuit board 240, and may play a role of covering and protecting the printed circuit board 240.

According to an embodiment, the antenna 270 may be disposed between the rear plate 280 and the battery 250. The antenna 270 may include a near field communication (NFC) antenna, a wireless charging antenna, and/or a magnetic secure transmission (MST) antenna. The antenna 270 may perform short-range communication with an external device, or may wirelessly transmit and/or receive power required for charging. An antenna structure may be formed by at least a portion of the first support member 300. The metal pieces 311 and 312 of the outer structure 210A may be used as an antenna radiator or an antenna ground.

According to various embodiments, the electronic device 200 may further include various components (or modules) in accordance with a provision form thereof. These components are so diversely changed according to the convergence trend of a digital device, so all of them may not be enumerated, but components of levels equivalent to those of the above mentioned components may be further included in the electronic device 200. Undoubtedly, the electronic device 200 may exclude specific components from the above components or replace the same with other components in accordance with a provision form thereof.

Figure 4:
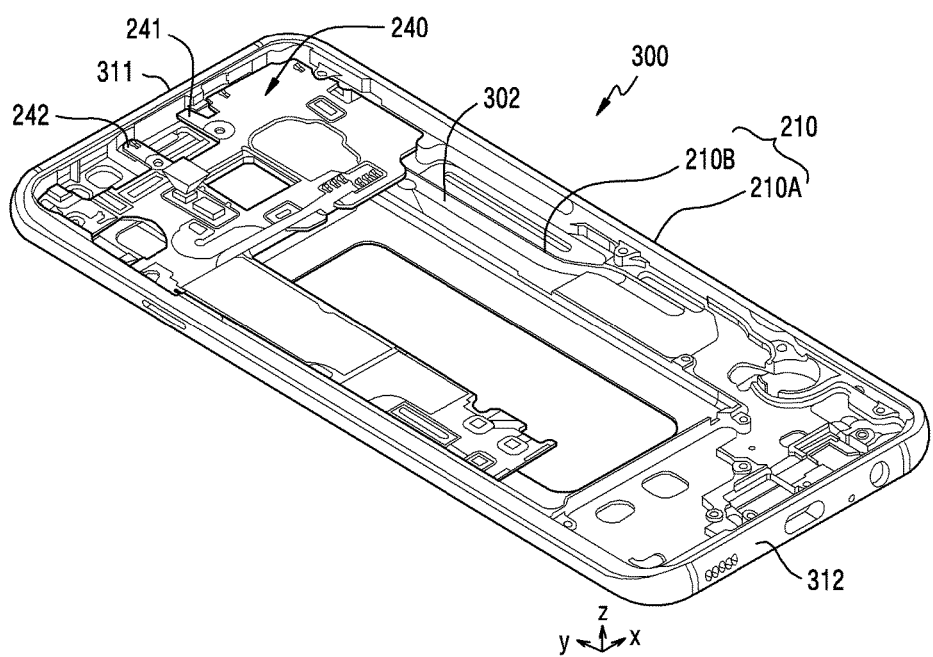
FIG. 4 is a diagram of a combined state of a first support member and a printed circuit board, according to an embodiment.

FIG. 4 is a diagram of a combined state of the first support member and the printed circuit board, according to an embodiment.

Referring to FIG. 4, according to an embodiment, the printed circuit board 240 may be combined to the mid-plate 302 of the first support member 300. Portions 241 and 242 of the printed circuit board 240 may be electrically connected with the metal piece 311 of the outer structure 210A. The other metal piece 312 of the outer structure 210B may be also electrically connected with a non-shown printed circuit board, and this printed circuit board may be a portion of the printed circuit board 240 or may be designed separately from the printed circuit board 240.

Referring to FIGS. 3 and 4, according to an embodiment, a flexible conductive member (or elastic conductive member), such as a C clip, a pogo-pin, a spring, a conductive poron or rubber, a conductive tape, a cooper connector or the like, may be disposed between the printed circuit board 240 and the terminals 311a or 312a of the outer structure 210A. By the medium of the flexible conductive member, the printed circuit board 240 may be electrically connected to the metal piece 311 or 312 of the outer structure 210A. The metal piece 311 or 312 may be used as an antenna radiator for wireless communication or an antenna ground.

For example, the printed circuit board 240 may include one or more wireless communication circuits (or modules) supporting the establishment of a wireless communication channel with an external electronic device and the execution of communication through the established communication channel According to an embodiment, the wireless communication circuits may include a cellular communication circuit, a short-range wireless communication circuit, a global navigation satellite system (GNSS) communication circuit or the like. The cellular communication circuit may be, for example, at least one of long term evolution (LTE), LTE-advanced (LTE-A), code division multiple access (CDMA), wideband CDMA (WCDMA), universal mobile telecommunications system (UMTS), wireless broadband (WiBro), global system for mobile communications (GSM) or the like. For example, the short-range wireless communication circuit may include, for example, at least one of wireless fidelity (WiFi), light fidelity (LiFi), Bluetooth (BT), Bluetooth low energy (BLE), Zigbee, near field communication (NFC), magnetic secure transmission (MST), radio frequency (RF), or body area network (BAN). For example, the GNSS communication circuit may be a global positioning system (GPS), a global navigation satellite system (Glonass), Beidou navigation satellite system (Beidou), or the European global satellite-based navigation system (Galileo). Several kinds of wireless communication circuits may be implemented as one chip or may be each implemented as a separate chip.

According to an embodiment, the wireless communication circuits may include one or more communication processors supporting wireless communication, operating independently from a processor such as an application processor. The wireless communication circuits may transmit a signal to an external electronic device through the antenna radiator such as the metal piece 311 or 312, or receive a signal from the external electronic device. The metal piece 312 may be used for a first network (e.g., a short-range communication network such as Bluetooth, Wi-Fi direct or Infrared Data Association (IrDA)), or a second network (e.g., a long-range communication network such as a cellular network, the Internet or a computer network (e.g., a LAN or a wide area network (WAN)).

According to various embodiments, a leakage current may flow to the first support member 300, and the leakage current may flow to the human body of a user who carries the electronic device, via the outer metallic portion 210A. This leakage current may induce human body's reaction (or symptom) such as unpleasant sensation, pain, muscle spasm, burn, killing or the like. The electronic device may receive power from an external power supply such as a charging device, etc., to charge a battery. Owing to a defect or damage of the external power supply device, an unintended high-voltage alternating current (AC) may be supplied from the external power supply device to the electronic device. The high-voltage AC may be leaked to the first support member 300. The metallic portion 210 may be designed to include an insulating material coated on a surface thereof, but, because a potential difference is fluctuated, the AC may flow through the insulating material as well. According to various embodiments, an unintended direct-current (DC) overcurrent outputted from the electronic device may be leaked to the first support member 300. In response to the outer metallic portion 210A being aged or damaged as the insulating material is stripped off due to aging, damage or the like, a possibility in which the leakage current flows to the human body may increase. According to various embodiments, another portion of the first support member 300 may be electrically connected to a leakage current breaking circuit by using an electrical connection structure (e.g., the flexible conductive member) described in FIG. 4. The leakage current breaking circuit may electrically connect the ground of the printed circuit board 240 and the first support member 300. The leakage current breaking circuit may stop the leakage current from flowing from the ground of the printed circuit board 240 to the first support member 300. The leakage current breaking circuit may be designed to transform a high-voltage AC introduced through a connector, into a low-voltage AC, or eliminate the high-voltage AC. The leakage current breaking circuit may be designed to transform a high-current AC introduced through the connector, into a low-current AC, or eliminate the high-current AC. The leakage current breaking circuit may be designed to transform a high-current AC introduced through the connector, into a low-current DC, or eliminate the high-current AC. The leakage current breaking circuit may be also designed to transform a high-voltage AC introduced through the connector, into a low-current DC, or eliminate the high-voltage AC.

Figure 5:
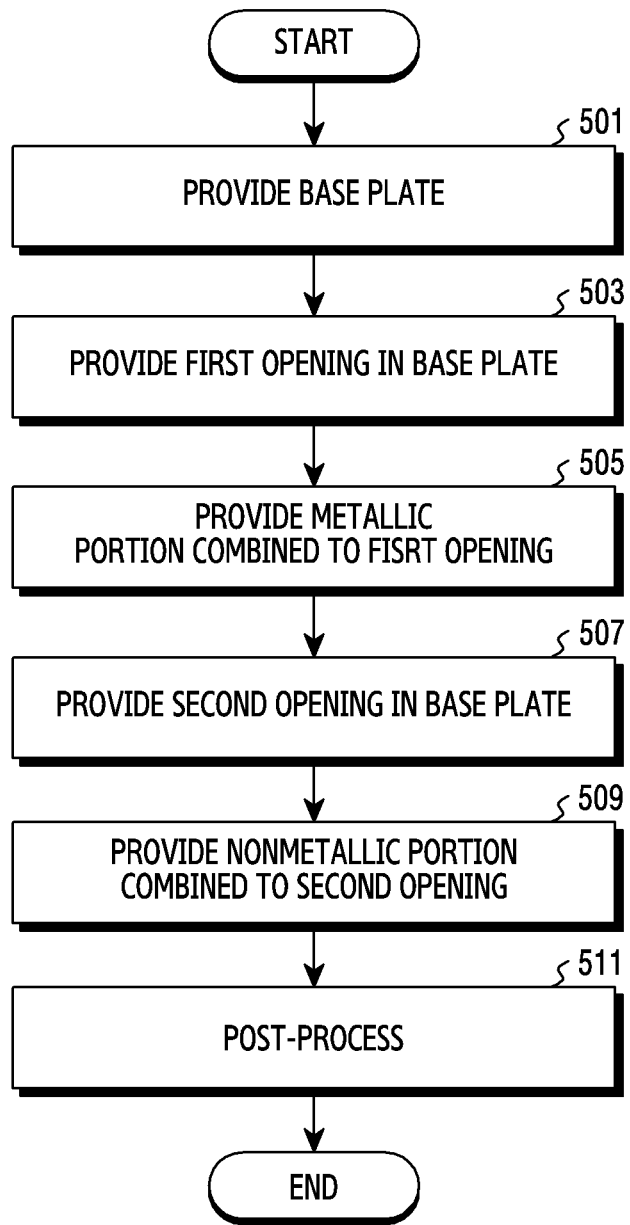
FIG. 5 is a flowchart for manufacturing of a first support member, according to an embodiment.

FIG. 5 is a flowchart of the manufacturing of a first support member, according to an embodiment. FIGS. 6A, 6B, 6C, 7A, 7B, 7C, 8A, 8B, 9A, 9B and 10 are diagrams of an electronic device for explaining a flowchart of FIG. 5, according to an embodiment. The flowchart of FIG. 5 will be explained below with reference to FIGS. 6A, 6B, 6C, 7A, 7B, 7C, 8A, 8B, 9A, 9B and 10.

At step 501, according to an embodiment, a base plate 600a may be provided. The base plate 600a may be generally rectangular, and may include extension portions 601 for fixing to a processing device. The base plate 600a may be formed of a first metallic material such as Ti, an amorphous alloy, a ceramic substance, a stainless steel, a SUS or the like. The base plate 600a is a member for forming the outer metallic portion 210A of FIG. 3. The first metallic material may be chosen such that the outer metallic portion 210A has designing aesthetic characteristics such as gloss. The first metallic material may be chosen to further have characteristics such as a mechanical strength, a chemical durability, a corrosion resistance, a heat tolerance, etc.

Figure 6A:
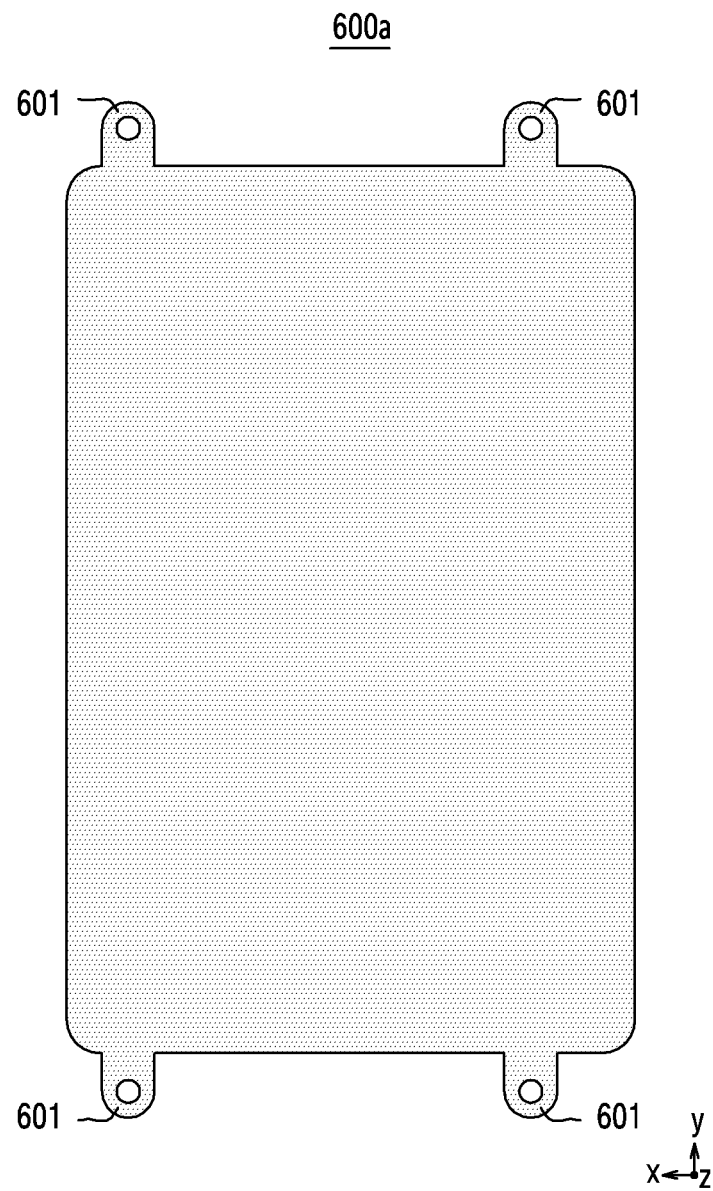
FIGS. 6A, 6B, 6C, 7A, 7B, 7C, 8A, 8B, 9A, 9B, and 10 are diagrams of an electronic device, according to an embodiment.
Figure 6B:
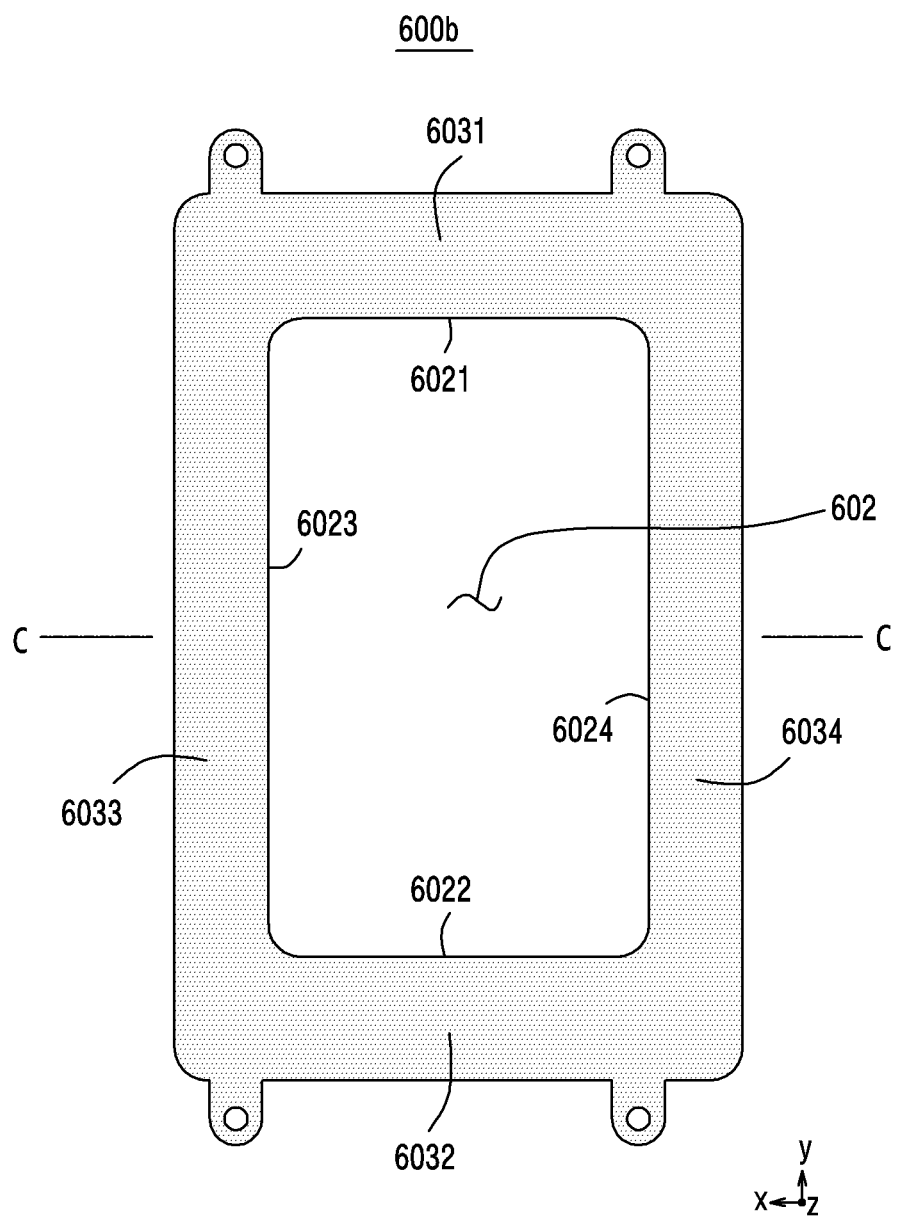

At step 503, according to an embodiment, a first plate 600b having a first opening (or a hollow portion) 602 provided in the base plate 600a may be formed. The first plate 600b may be a generally rectangular ring shape including a first portion 6031, a second portion 6032, a third portion 6033 and a fourth portion 6034. Referring to FIGS. 3 and 6B, the frames 311, 312, 313 and 314 of the outer metallic portion 210A may be formed from the first portion 6031, the second portion 6032, the third portion 6033 and the fourth portion 6034.

Figure 6C:
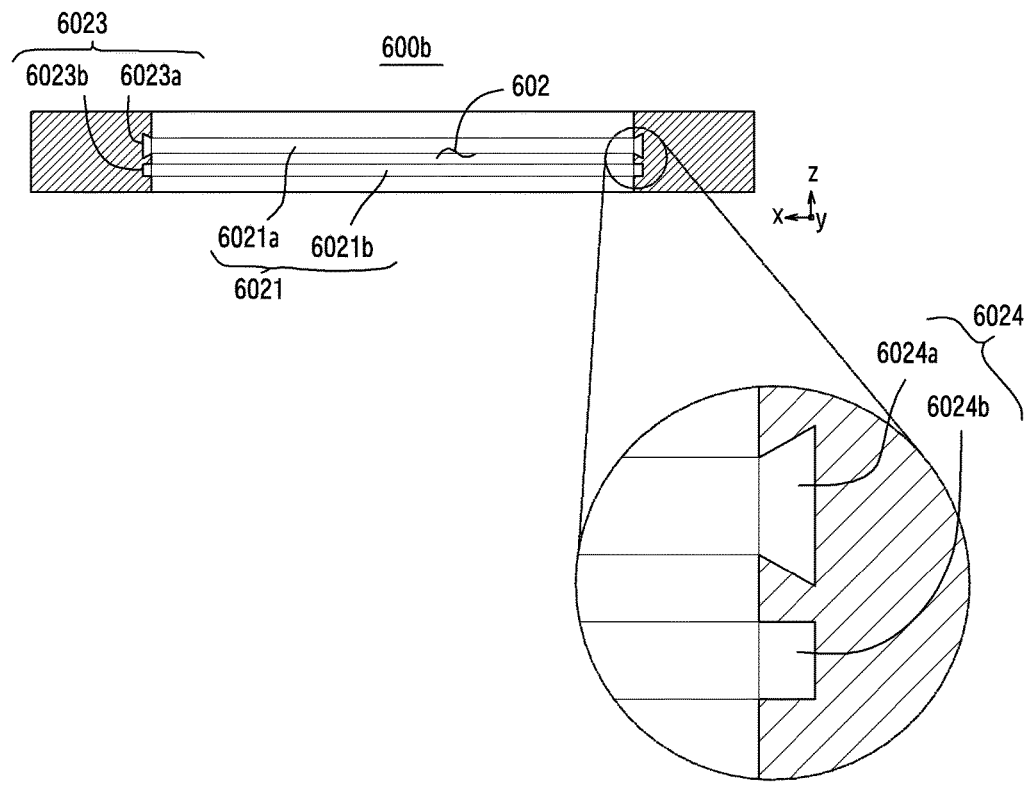

Referring to FIGS. 3 and 6B, according to an embodiment, the first opening 602 may correspond to the first space portion 301 in which the inner metallic portion (e.g., 210B of FIG. 3) is combined. The first opening 602 may include a first inner surface 6021 provided by the first portion 6031, a second inner surface 6022 provided by the second portion 6032, a third inner surface 6023 provided by the third portion 6033, and a fourth inner surface 6024 provided by the fourth portion 6034. FIG. 6C is an x-z section corresponding to a C-C portion of the first plate 600b of FIG. 6B. Referring to FIG. 6C, the fourth inner surface 6024 of the first opening 602 may be designed to include one or more grooves 6024a and 6024b. The third inner surface 6023 opposite the fourth inner surface 6024 may be also designed to include one or more grooves 6023a and 6023b. The first inner surface 6021 of the first opening 602 may also include one or more grooves 6021a and 6021b. These grooves 6021a and 6021b may connect the grooves 6023a and 6023b of the third inner surface 6023 and the grooves 6024a and 6024b of the fourth inner surface 6024. Though not illustrated, the second inner surface 6022 may include grooves which connect the grooves 6023a and 6023b of the third inner surface 6023 and the grooves 6024a and 6024b of the fourth inner surface 6024. According to various embodiments, some of the first inner surface 6021, the second inner surface 6022, the third inner surface 6023 or the fourth inner surface 6024 may be designed to have the grooves as well. A metallic portion for forming the inner metallic portion 210B may be combined to the first opening 602 of the first plate 600b. The inner surfaces 6021, 6022, 6023 and 6024 including the above grooves may improve a bonding force of the first plate 600b and the metallic portion by increasing a junction area between the first plate 600b and the metallic portion. One of these grooves 6023a or 6024a may be designed in a form for the dovetail joint of the first plate 600b and the inner metallic portion. Besides this, the inner surfaces 6021, 6022, 6023 and 6024 of the first opening 602 may be designed in various forms for a fitting structure between the first plate 600b and the metallic portion.

According to an embodiment, the first plate 600b having the above grooves may be formed through computer numerical control (CNC), die casting, pressing, etc. The grooves may be provided in the inner surfaces 6021, 6022, 6023 and 6024 of the first opening 602 through surface cutting using a laser, a scratcher or the like, etching, or the like as well.

At step 505, according to an embodiment, a second plate 700 combining a metallic portion 701 of a second metallic material to the first opening 602 of the first plate 600b may be formed. FIG. 7B is an x-z section corresponding to a D-D portion of the second plate 700 of FIG. 6A. Referring to FIG. 7B, a first junction layer 703 may be interposed in an interface between the first plate 600b and the metallic portion 701. The first plate 600b formed of the first metallic material may be coated with a material of the first junction layer 703 and, through die casting, the metallic portion 701 of the second metallic material may be formed. The first junction layer 703 may be a material that reacts to heat or pressure generated while the metallic portion 701 combined to the first plate 600*b* is formed. The material of the first junction layer 703 may react to heat or pressure, to be tightly combined to the first plate 600*b* and the metallic portion 701. While the metallic portion 701 is formed, the material of the first junction layer 703 may be fused to the first plate 600*b*. In response to the second metallic material of a melted state being injected into a mold in which the first plate 600*b* is disposed, a fusion layer between the material of the first junction layer 703 and the second metallic material may be formed.

According to an embodiment, the first junction layer 703 may include a material capable of increasing a bonding force between the first plate 600*b* and the metallic portion 701 of mutually different metallic materials, and may be bonded to all of the first plate 600*b* and the metallic portion 701. The first junction layer 703 may be chosen as a material capable of increasing all of an interfacial bonding force between the first junction layer 703 and the first plate 600*b* and an interfacial bonding force between the first junction layer 703 and the metallic portion 701. FIG. 7C illustrates a combined state of the first plate 600*b* and the metallic portion 701 by the medium of the first junction layer 703. Referring to FIG. 7C, in the die casting, the first junction layer 703 may react to heat, to make a junction of the first plate 600*b* and the metallic portion 701 tight.

According to an embodiment, the first junction layer 703 may include a material having a lower melting point than the first metallic material of the first plate 600*b* or the second metallic material of the metallic portion 701.

According to an embodiment, the first junction layer 703 may include a low-melting-point compound. The first junction layer 703 may be a plating layer. The plating layer may be formed on the first plate 600*b* in various plating schemes. The first junction layer 703 may be designed as a metallic layer formed of other various different metallic materials.

Referring to FIG. 7B, according to various embodiments, the metallic portion 701 may be designed to cover a portion of an upper surface 6001 or lower surface 6002 of the first plate 600*b* as well. In this design, the first junction layer 703 may be interposed even between the upper surface 6001 or lower surface 6002 of the first plate 600*b* and the metallic portion 701.

Figure 7A:
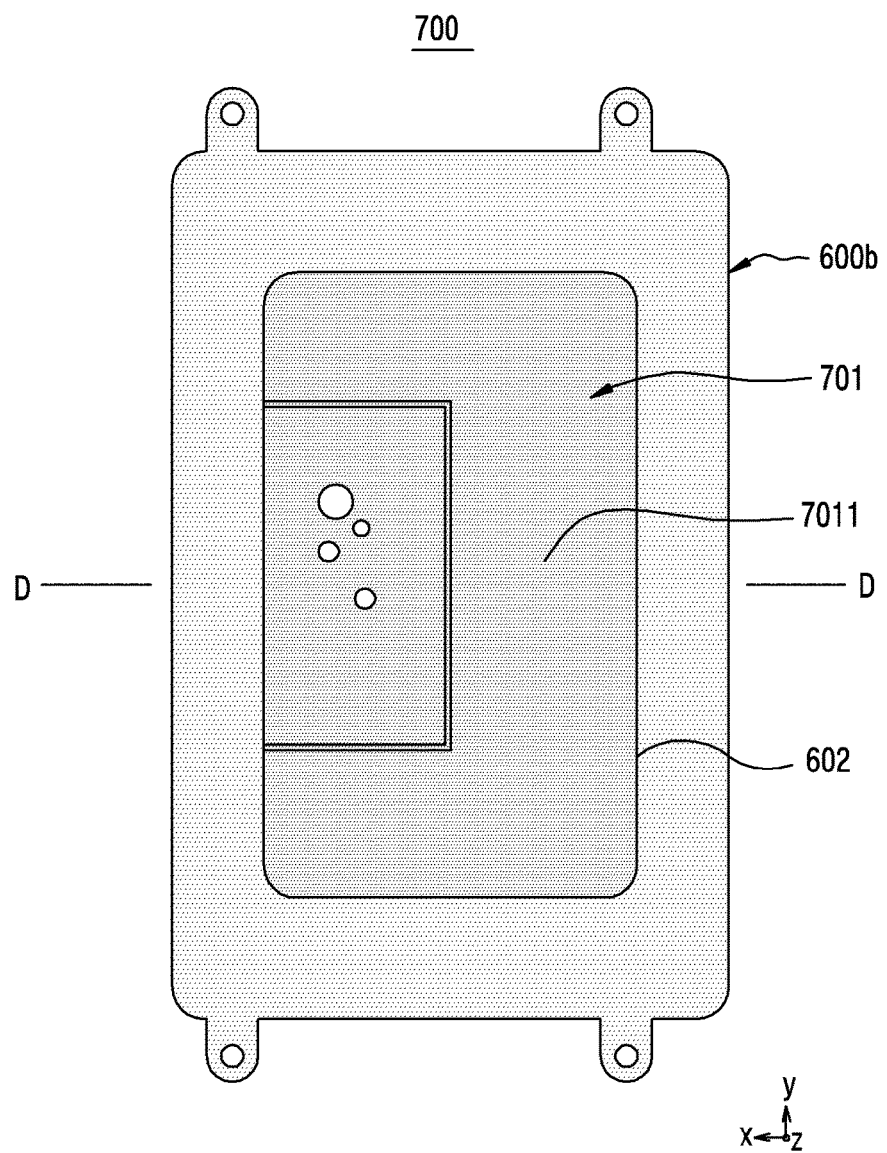
Figure 7B:
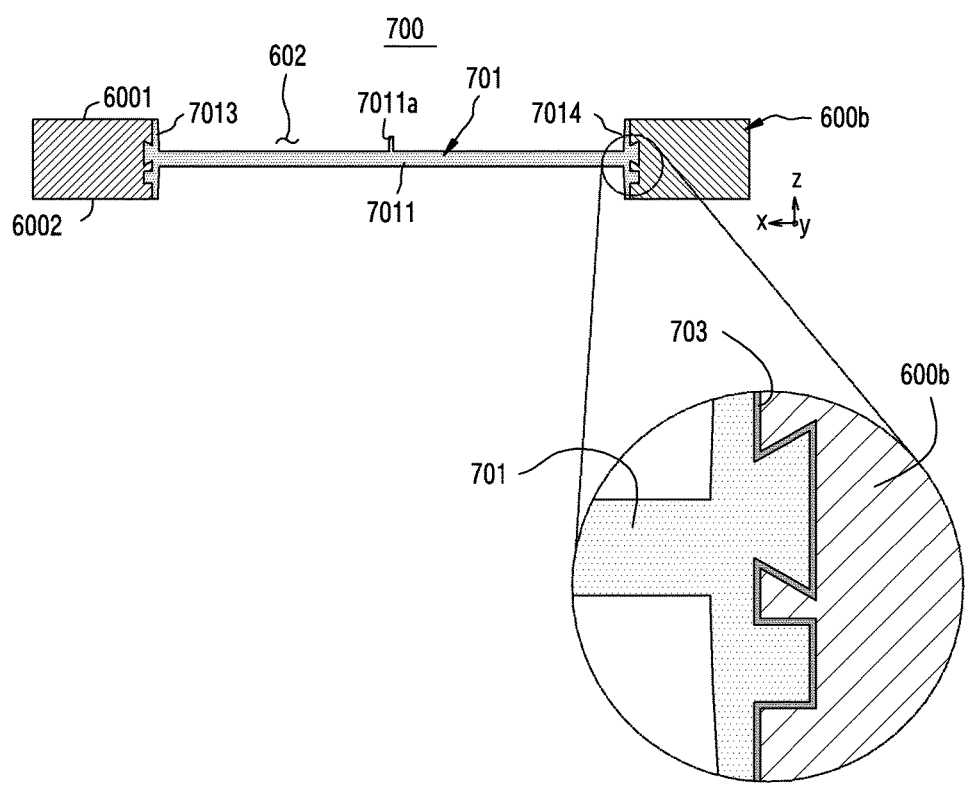
Figure 7C:
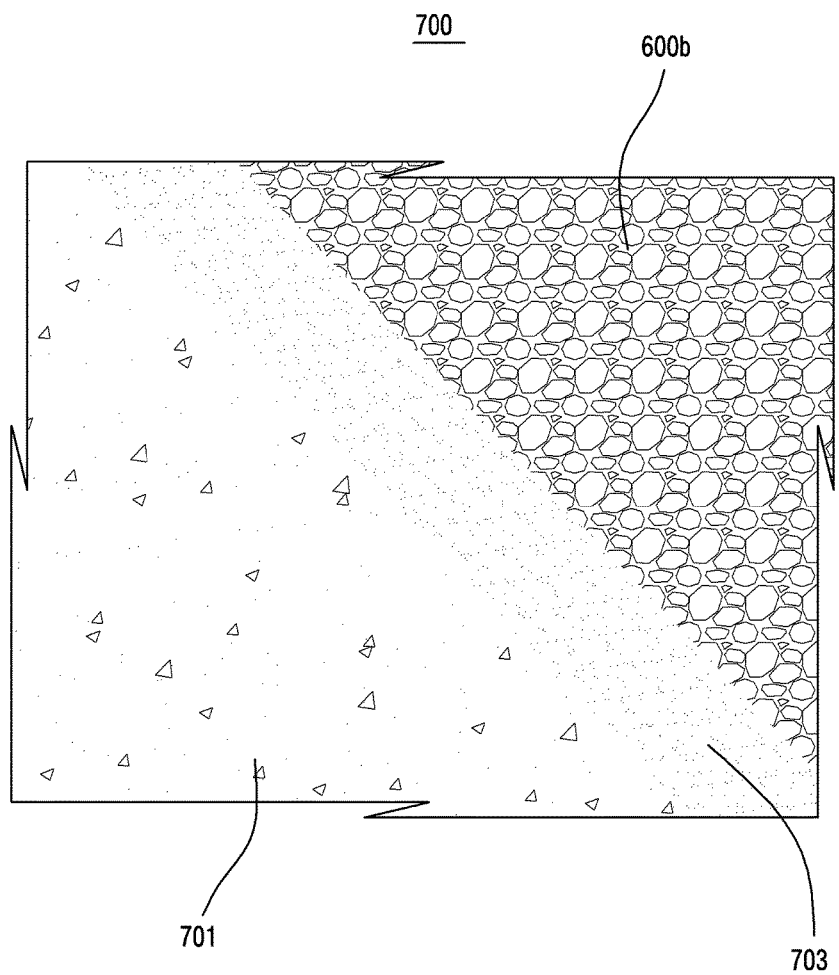

Referring to FIGS. 7A and 7B, according to an embodiment, the metallic portion 701 may have an H-shape section structure. This H-shape section structure may improve torsional rigidity, durability or the like. The metallic portion 701 may include a plate portion 7011 between portions 7013 and 7014 combined to the first opening 602 of the first plate 600*b*. The plate portion 7011 may be designed in a form for combining with electronic components (e.g., the printed circuit board 240 of FIG. 2) of the electronic device or supporting them. The plate portion 7011 may include a protrusion 7011*a* for supporting a battery 250, etc.

Figure 8A:
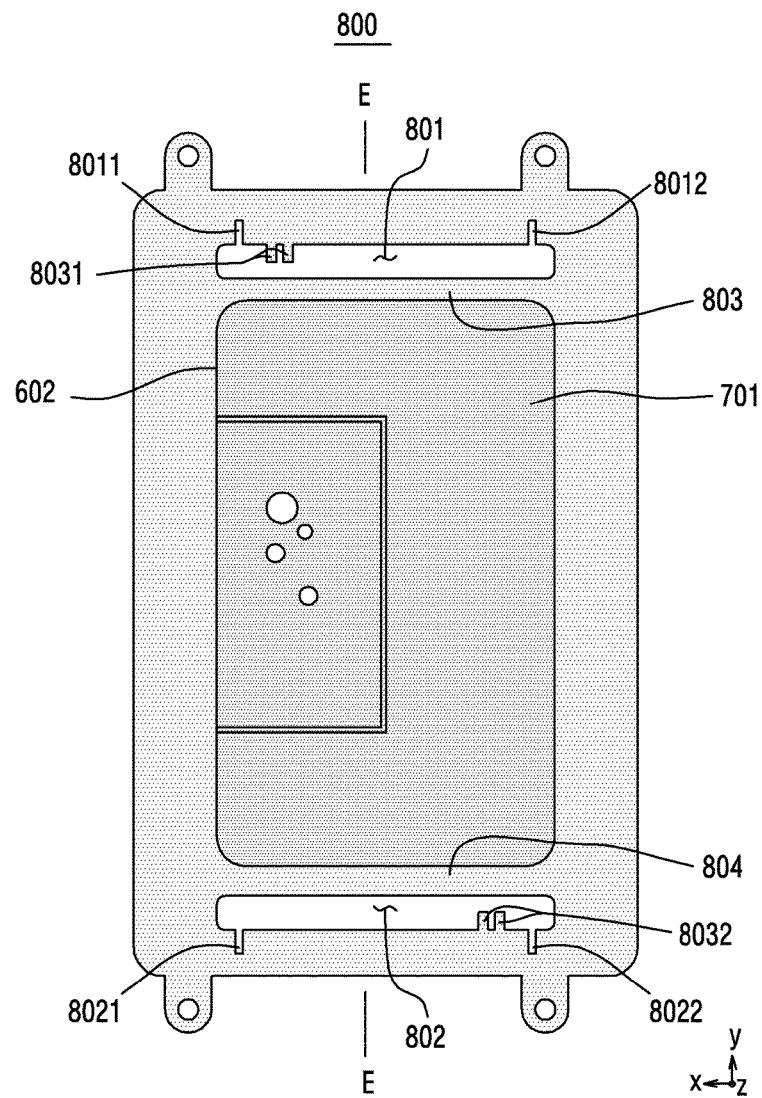

At step 507, according to an embodiment, a third plate 800 having one or more second openings 801 and 802 provided in the first plate 600*b* of the second plate 700 may be provided. The one second opening 801 is provided by cutting out a portion of the first portion 6031 of the first plate 600*b*, and the other one second opening 802 may be provided by cutting out a portion of the second portion 6032 of the first plate 600*b*. Referring to FIGS. 3 and 8A, the second openings 801 and 802 may correspond to the second space portions 302*a* and 302*b* in which the inner nonmetallic portion 290 is combined. The second plate 700 may include a first portioning portion 803 and a second portioning portion 804. The first portioning portion 803 may be disposed between the first opening 602 and the one second opening 801. The second portioning portion 804 may be disposed between the first opening 602 and the other one second opening 802.

Referring to FIGS. 3 and 8A, according to an embodiment, the second openings 801 and 802 may include spaces 8011, 8012, 8021 and 8022 for gaps in which the portions 2901 of the inner nonmetallic portion 290 are disposed.

Referring to FIGS. 3 and 8A, according to an embodiment, the third plate 800 may include terminals 8031 and 8032 electrically connected with the printed circuit board.

Figure 8B:
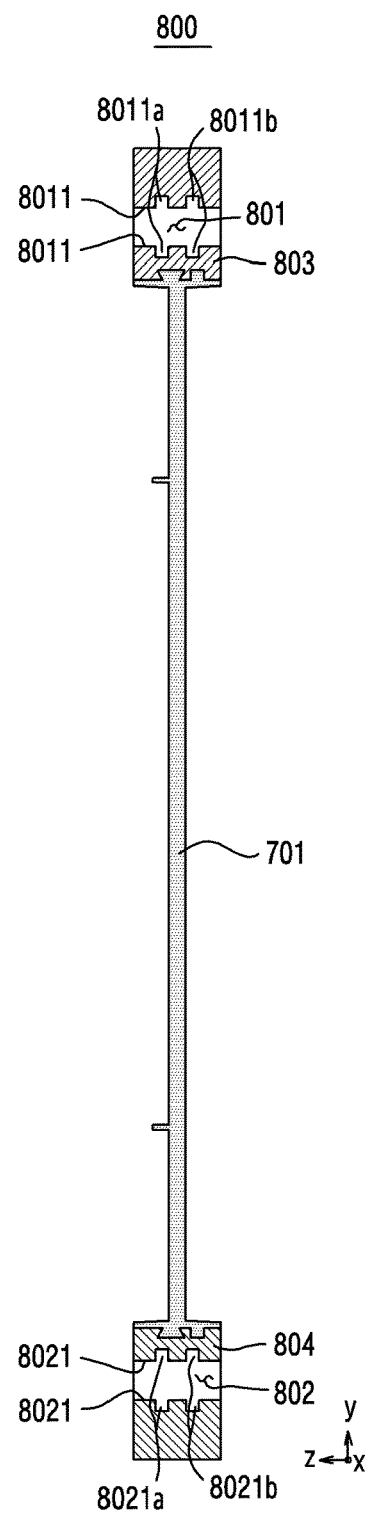

FIG. 8B is a y-z section corresponding to an E-E portion of the third plate 800 of FIG. 8A. Referring to FIGS. 8A and 8B, according to an embodiment, inner surfaces 8011 and 8021 of the second openings 801 and 802 may include one or more grooves 8011*a*, 8011*b*, 8021*a* and 8021*b*. A nonmetallic portion for forming the inner nonmetallic portion 290 may be combined to the second openings 801 and 802. These grooves 8011*a*, 8011*b*, 8021*a* and 8021*b* may increase a junction area between the metallic portion and the nonmetallic portion, to improve a bonding force between the metallic portion and the nonmetallic portion. According to various embodiments, the grooves 8011*a*, 8011*b*, 8021*a* and 8021*b* may be designed in a form for a fitting structure such as a dovetail joint as well. According to an embodiment, the grooves 8011*a*, 8011*b*, 8021*a* and 8021*b* of the inner surfaces 8011 and 8021 may be provided using CNC, a laser, a scratcher, etching, etc.

According to an embodiment, a step of providing the second openings 801 and 802 may be included in step 503 of providing the first opening 602 as well.

Figure 9A:
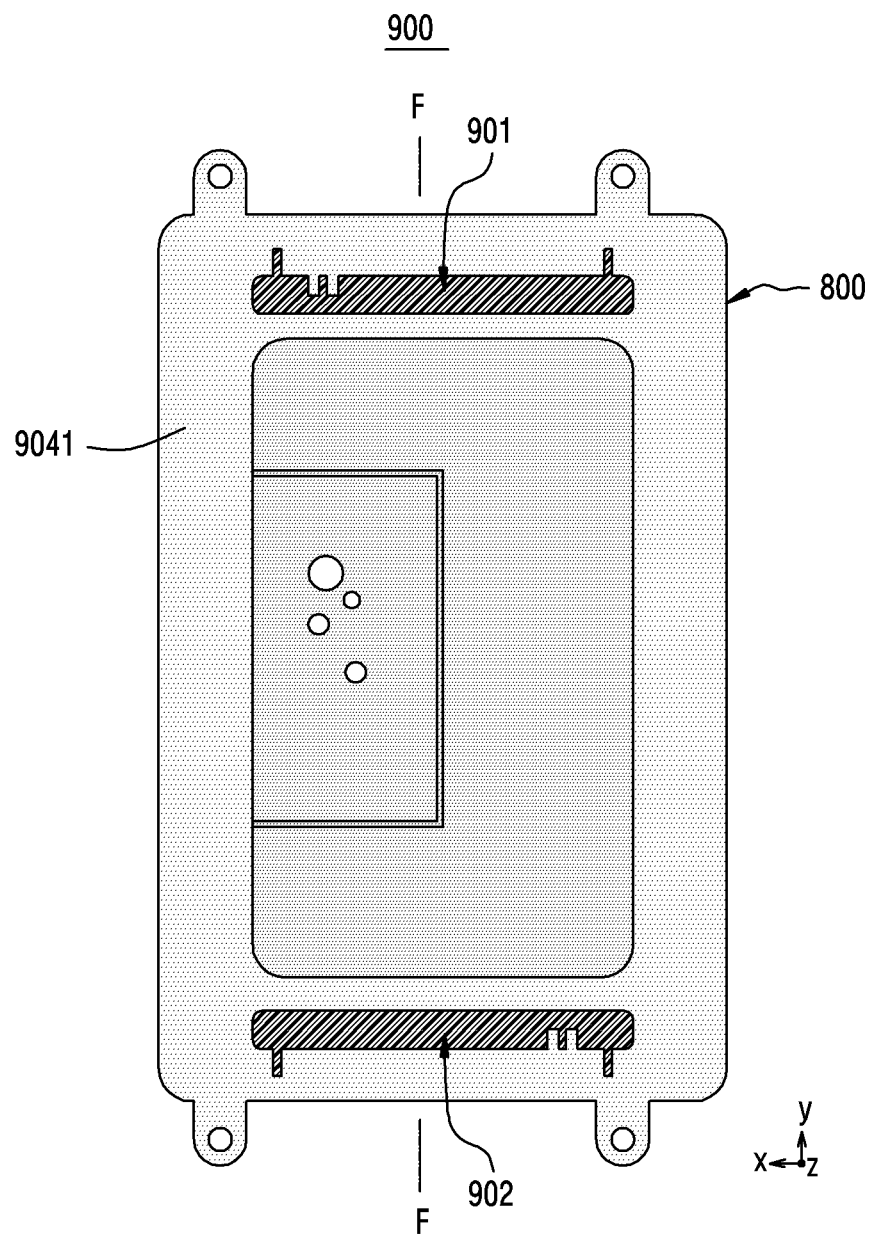
Figure 9B:
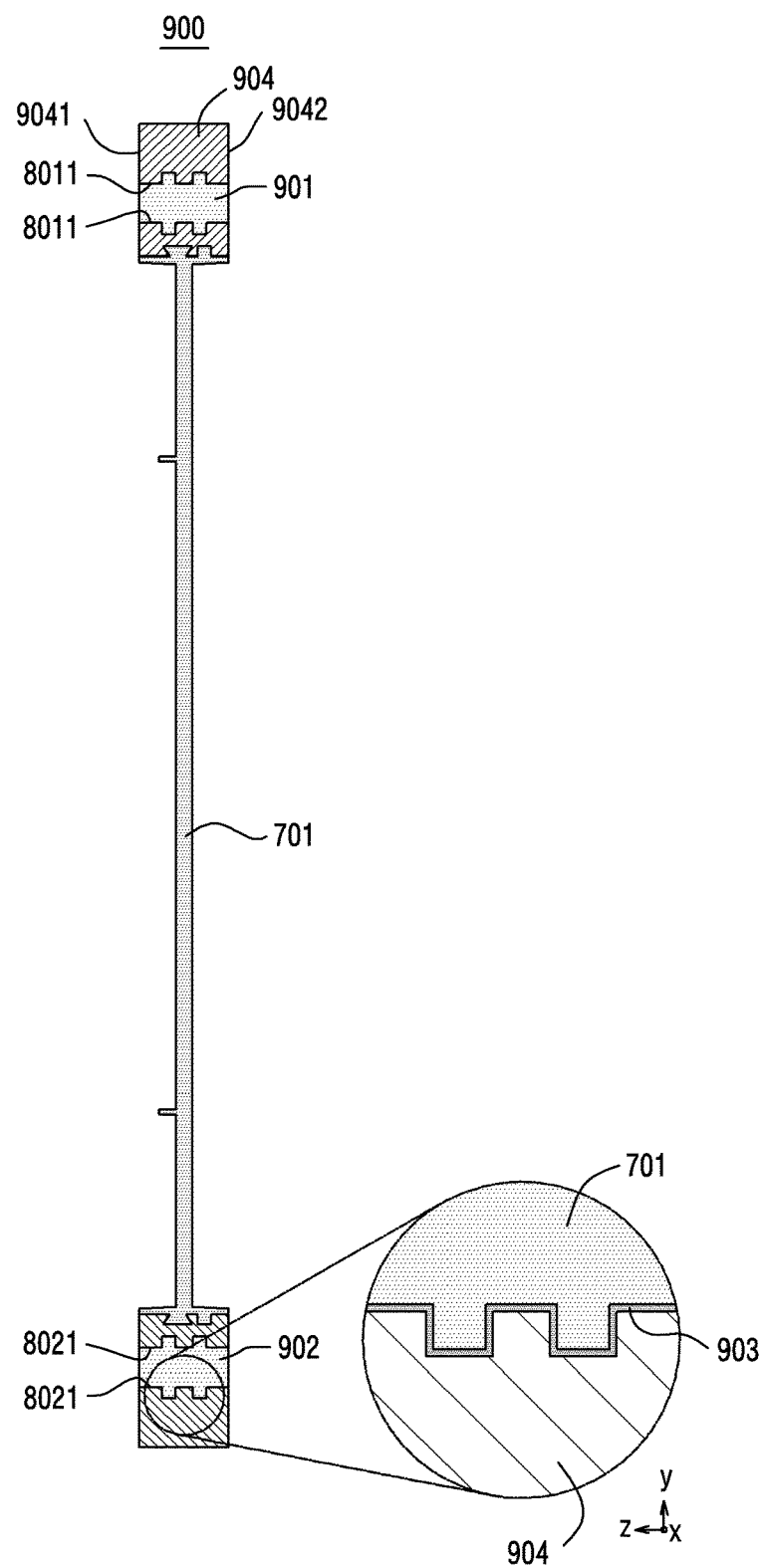

At step 509, according to an embodiment, a fourth plate 900 having nonmetallic portions 901 and 902 of a first polymer combined to the second openings 801 and 802 of the third plate 800 may be formed. The nonmetallic portion 901 combined to the one second opening 801 and the nonmetallic portion 902 combined to the other second opening 802 may be designed to include mutually different materials as well. FIG. 9B is a y-z section corresponding to an F-F portion of the fourth plate 900 of FIG. 9A. Referring to FIG. 9B, a second junction layer 903 may be interposed in an interface of inner surfaces 8011 and 8021 of the second openings 801 and 802 of the third plate 800. The nonmetallic portions 901 and 902 may be formed by forming the second junction layer 903 including a second polymer such as triazine thiol, dithio pyrimidine, silane-based compound, etc., in the inner surfaces 8011 and 8021 of the second openings 801 and 802 and then injecting the fused first polymer through insert injection. The second junction layer 903 may be a material that reacts to heat or pressure generated while the nonmetallic portions 901 and 902 combined to the metallic portion 904 is formed. The material of the second junction layer 903 may react to heat or pressure, to be tightly combined to the metallic portion 904 and the nonmetallic portions 901 and 902. The second junction layer 903 may be designed as an organic layer including other various different organic matters.

According to an embodiment, the first junction layer 703 may be a material that does not react to heat or pressure generated while the nonmetallic portions 901 and 902 combined to the metallic portion 904 are formed. While the nonmetallic portions 901 and 902 combined to the metallic portion 904 are formed, the first junction layer 703 may be maintained in a state of being tightly combined to the two metallic portions 904 and 701.

According to an embodiment, the first polymer of the nonmetallic portions 901 and 902 may be a material different from the second polymer of the second junction layer 903, and may include, for example, polyether ether ketone, polyphenylene sulfide, polybutylene terephthalate, polyimide, polycarbonate or the like.

Referring to FIG. 9B, according to an embodiment, the nonmetallic portions 901 and 902 may be designed to cover a portion of an upper surface 9041 or lower surface 9042 of the first metallic portion 904 as well. In this design, the second junction layer 903 may be interposed even between the upper surface 9041 or lower surface 9042 of the metallic portion 904 and the inner nonmetallic portion 901.

At step 511, according to an embodiment, a first support member 1000 including an outer metallic portion 1010A of a first metallic material, an inner metallic portion 1010B of a second metallic material, and inner polymeric portions 1090 of polymer may be formed through post-processing such as cutting, polishing, surface treating (e.g., depositing, anodizing, painting, etc.) of the fourth plate 900.

Figure 10:
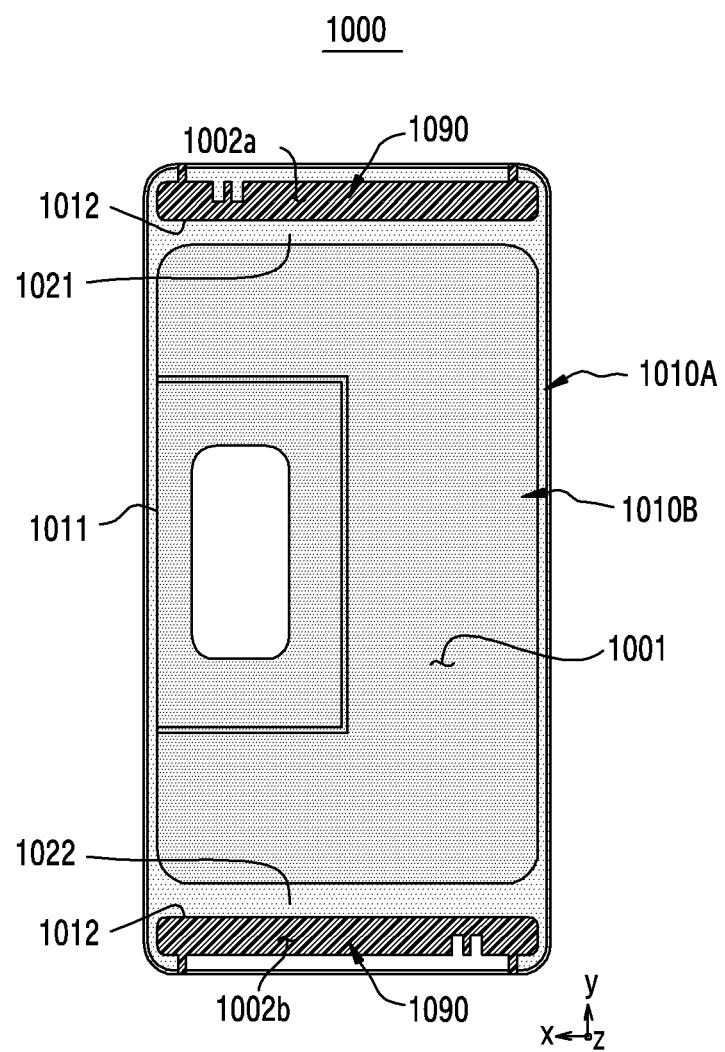

Referring to FIG. 10, according to an embodiment, the outer metallic portion 1010A may include a first space portion 1001, and second space portions 1002a and 1002b divided by portioning portions 1021 and 1022. The inner metallic portion 1010B may be combined to the first space portion 1001. The first inner polymeric portion 1090 may be combined to the second space portions 1002a and 1002b. A first junction layer 703 may be interposed in a first interface 1011 between the outer metallic portion 1010A and the inner metallic portion 1010B. A second junction layer 903 may be interposed in a second interface 1012 between the outer metallic portion 1010A and the first inner polymeric portion 1090. The first interface 1011 and/or the second interface 1012 may be designed to have a fitting structure for increasing a bonding force between two members.

According to an embodiment, the first interface 1011 and the second interface 1012 may endure, without being separated, a shock of falling due to the fitting structure with the first and second junction layers 703 and 903, so the durability and/or waterproof performance of the first support member 1000 may be secured. The portioning portions 1021 and 1022 may strengthen the torsional rigidity or durability of the first support member 1000, and may provide resistance for stopping the first interface 1011 and the second interface 1012 from being separated by an external shock.

According to an embodiment, the first support member 1000 may include the inner metallic portion 1010B of the second metallic material having at least one characteristic different from that of the first metallic material of the outer metallic portion 1010A forming an appearance of the electronic device and accordingly, compared with a non-shown support member formed integrally with the first metallic material, may make it easy to satisfy various conditions such as a weight, thermal conductive characteristics, electrical conductive characteristics, etc., required for the electronic device. Accordingly, while the second interface 1012 is stably bonded and maintained, a waterproof performance of satisfying substance characteristics of the first support member 1000 required for the electronic device may be secured.

According to various embodiments, in response to the outer metallic portion 1010A being formed of a difficult-to-cut material such as a SUS and Ti, the inner metallic portion 1010B may be designed as a second metallic material whose processing is easier than this difficult-to-cut material. This may be easily processed compared with the non-shown metallic portion integrally formed of the difficult-to-cut material.

Assuming the manufacturing of a support member not having the portioning portions 1021 and 1022, there may be an attempt to bind an interface between an inner metallic portion and an inner nonmetallic portion disposed inside an outer metallic portion so as to secure durability. The inner nonmetallic portion may be combined to a metal structure in a scheme of molding the metal structure consisting of an outer metallic portion and an inner metallic portion formed of a metallic material and then, injecting a fused polymer into the metal structure through injection. There may be an interface between the inner nonmetallic portion and the outer metallic portion, and an interface between the inner nonmetallic portion and the inner metallic portion. In this injection, a junction layer may be interposed in the interfaces but, because the outer metallic portion and the inner metallic portion are formed of mutually different metallic materials, a material of this junction layer may be difficult to secure all of a bonding force of the interface between the inner nonmetallic portion and the outer metallic portion and a bonding force of the interface between the inner nonmetallic portion and the inner metallic portion. In contrast, the portioning portions 1021 and 1022 of the outer metallic portion 1010A according to an embodiment of the present disclosure may remove the interface between the inner nonmetallic portion 1090 and the inner metallic portion 1010B and therefore, an operation of molding the inner nonmetallic portion 1090 may be implemented to provide a tight junction between the inner nonmetallic portion 1090 and the outer metallic portion 1010A without considering a junction between the inner nonmetallic portion 1090 and the inner metallic portion 1010B.

According to an embodiment of the present disclosure, the electronic device 200 may include a frame structure (e.g., the frame structure of FIG. 1A or 1B, or the first support member 300 of FIG. 3), and the frame structure may include an outer metallic portion 210A including a first metallic material and forming at least a portion of an outer surface of the electronic device 200, and an inner metallic portion 210B including a second metallic material different from the first metallic material and laterally surrounded by the outer metallic portion 210A, and a first inner polymeric portion (e.g., the inner nonmetallic portion 290) isolated from the inner metallic portion 210B and at least partially laterally surrounded by the outer metallic portion 210A. The electronic device 200 may include a wireless communication circuit electrically connected to a portion of the outer metallic portion 210A.

According to an embodiment of the present disclosure, the first metallic material may include a SUS, and the second metallic material may include Al.

According to an embodiment of the present disclosure, the first metallic material may be more rigid than the second metallic material.

According to an embodiment of the present disclosure, the electronic device 200 may further include a first glass plate (e.g., the front plate 102 of FIG. 1A), and a second glass plate (e.g., the rear plate 111 of FIG. 1B) facing away from the first glass plate. The first glass plate and the second glass plate may be mounted or connected to the outer metallic portion 210A.

According to an embodiment of the present disclosure, the inner metallic portion 210B and the first inner polymeric portion 290 may be interposed between the first glass plate (e.g., the front plate 102 of FIG. 1A) and the second glass plate (e.g., the rear plate 111 of FIG. 1B).

According to an embodiment of the present disclosure, the inner metallic portion 210B may include an opening (e.g., the opening 3021 or 3022 of FIG. 2).

According to an embodiment of the present disclosure, the first inner polymeric portion 290 may include at least one protrusion portion (e.g., the portion 121 of FIG. 1A or 1B) that is extended outside to form a portion of the outer surface of the electronic device 200.

According to an embodiment of the present disclosure, the frame structure 300 may further include a second inner polymeric portion (e.g., the second inner polymeric portion 290b of FIG. 3) that is isolated from the inner metallic portion 210B and the first inner polymeric portion 290a and is at least partially surrounded by the outer metallic portion 210A.

According to an embodiment of the present disclosure, when viewed from above the first glass plate (e.g., the front plate of FIG. 1A), the inner metallic portion 210B may be disposed between the first inner polymeric portion 290a and the second inner polymeric portion 290b.

According to an embodiment of the present disclosure, the frame structure 300 may include an organic layer (e.g., the second junction layer 903 of FIG. 9B) between the outer metallic portion 210A and the first inner polymeric portion 290a.

According to an embodiment of the present disclosure, the frame structure 300 may include a metallic layer (e.g., the first junction layer 703 of FIG. 7B) that includes a third metallic material different from the first and second metallic materials and is interposed between the outer metallic portion 210A and the inner metallic portion 210B.

According to an embodiment of the present disclosure, the metallic layer 703 may include a material that reacts to heat or pressure generated while the inner metallic portion 210B combined to the outer metallic portion 210A is formed.

According to an embodiment of the present disclosure, the metallic layer 703 may include a material that does not react to heat or pressure generated while the first inner polymeric portion 290 combined to the outer metallic portion 210A is formed.

According to an embodiment of the present disclosure, the metallic layer 703 may include a low-melting compound, or may be a plating layer.

According to an embodiment of the present disclosure, the organic layer 903 may include a material that reacts to heat or pressure generated while the first inner polymeric portion combined to the outer metallic portion is formed.

According to an embodiment of the present disclosure, the organic layer 903 may include triazine thiol, dithio pyrimidine, or a silane-based compound.

According to an embodiment of the present disclosure, an interface between the outer metallic portion 210A and the inner metallic portion 210B, or an interface between the outer metallic portion 210A and the first inner polymeric portion 290 may include a fitting structure.

According to an embodiment of the present disclosure, the outer metallic portion 210A may include a portion (e.g., the portioning portion 321 of 322 of FIG. 3) that is disposed between the inner metallic portion 210B and the first inner polymeric portion 290 and physically isolates the inner metallic portion 210B and the first inner polymeric portion 290.

According to an embodiment of the present disclosure, the outer metallic portion 210A may include a plurality of gaps and a plurality of portions (e.g., the portions 311, 312 of FIG. 3) physically isolated by the plurality of gaps, and portions (e.g., the portions 121 of FIG. 1A or 1B) of the first inner polymeric portion 290 may be disposed in the gaps and form a portion of the outer surface of the electronic device 200.

According to an embodiment of the present disclosure, the first inner polymeric portion 290 may include polyether ether ketone, polyphenylene sulfide, polybutylene terephthalate, polyimide, or polycarbonate.

According to an embodiment of the present disclosure, the inner metallic portion 210B may be formed of a metallic material having less specific gravity than a metallic material of the outer metallic portion 210A.

Figure 11:
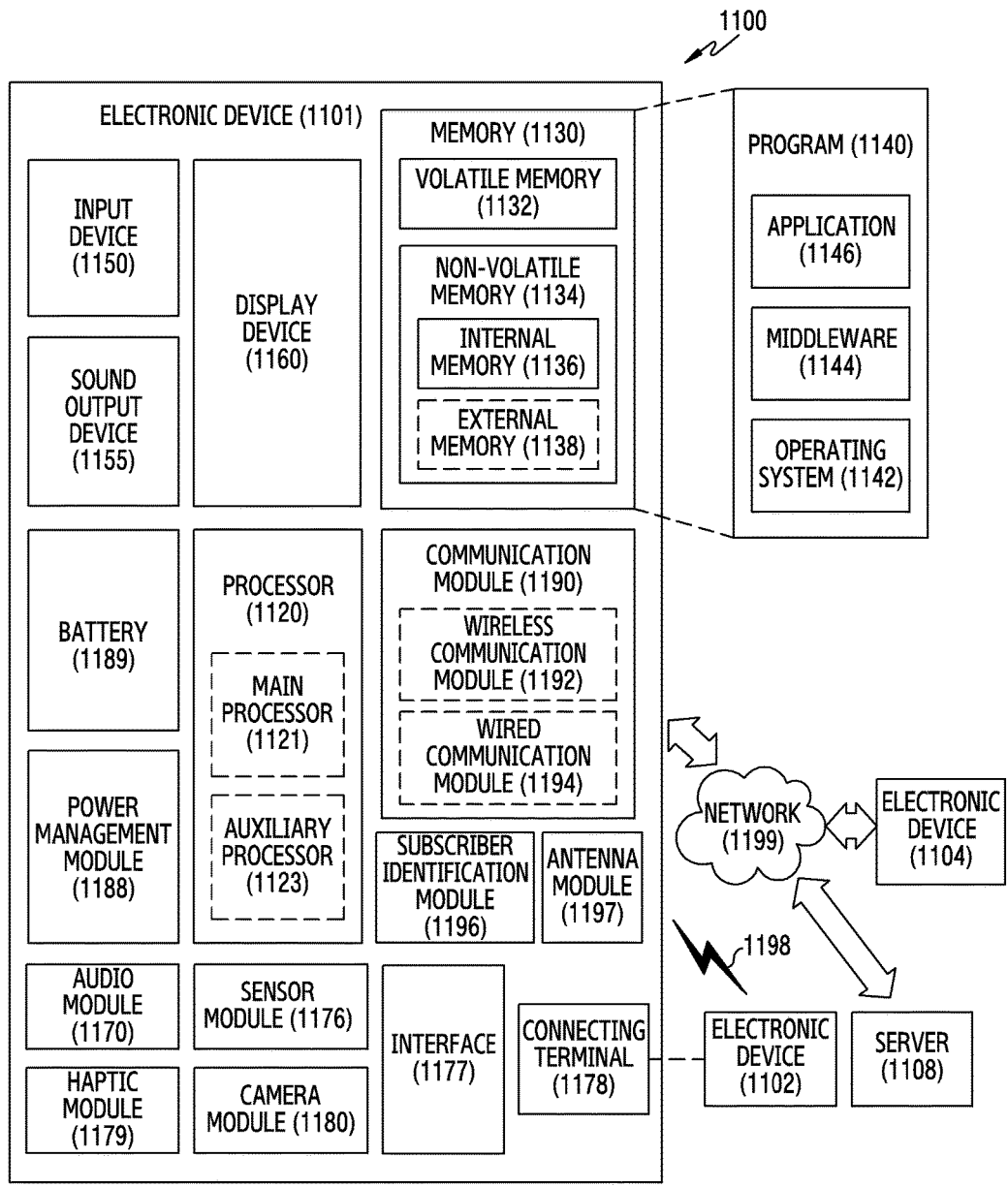
FIG. 11 is a diagram of an electronic device in a network environment, according to an embodiment.

FIG. 11 is a block diagram illustrating an electronic device 1101 in a network environment 1100 according to various embodiments. Referring to FIG. 11, the electronic device 1101 in the network environment 1100 may communicate with an electronic device 1102 via a first network 1198 (e.g., a short-range wireless communication network), or an electronic device 1104 or a server 1108 via a second network 1199 (e.g., a long-range wireless communication network). The electronic device 1101 may communicate with the electronic device 1104 via the server 1108. According to an embodiment, the electronic device 1101 may include a processor 1120, memory 1130, an input device 1150, a sound output device 1155, a display device 1160, an audio module 1170, a sensor module 1176, an interface 1177, a haptic module 1179, a camera module 1180, a power management module 1188, a battery 1189, a communication module 1190, a subscriber identification module (SIM) 1196, or an antenna module 1197. At least one (e.g., the display device 1160 or the camera module 1180) of the components may be omitted from the electronic device 1101, or one or more other components may be added in the electronic device 1101. In some embodiments, some of the components may be implemented as single integrated circuitry. For example, the sensor module 1176 (e.g., a fingerprint sensor, an iris sensor, or an illuminance sensor) may be implemented as embedded in the display device 1160 (e.g., a display).

The processor 1120 may execute, for example, software (e.g., a program 1140) to control at least one other component (e.g., a hardware or software component) of the electronic device 1101 coupled with the processor 1120, and may perform various data processing or computation. According to one embodiment, as at least part of the data processing or computation, the processor 1120 may load a command or data received from another component (e.g., the sensor module 1176 or the communication module 1190) in volatile memory 1132, process the command or the data stored in the volatile memory 1132, and store resulting data in non-volatile memory 1134. The processor 1120 may include a main processor 1121 (e.g., a central processing unit (CPU) or an application processor (AP)), and an auxiliary processor 1123 (e.g., a graphics processing unit (GPU), an image signal processor (ISP), a sensor hub processor, or a communication processor (CP)) that is operable independently from, or in conjunction with, the main processor 1121. Additionally or alternatively, the auxiliary processor 1123 may be adapted to consume less power than the main processor 1121, or to be specific to a specified function. The auxiliary processor 1123 may be implemented as separate from, or as part of the main processor 1121.

The auxiliary processor 1123 may control at least some of functions or states related to at least one component (e.g., the display device 1160, the sensor module 1176, or the communication module 1190) among the components of the electronic device 1101, instead of the main processor 1121 while the main processor 1121 is in an inactive (e.g., sleep)

state, or together with the main processor 1121 while the main processor 1121 is in an active state (e.g., executing an application). According to an embodiment, the auxiliary processor 1123 (e.g., an image signal processor or a communication processor) may be implemented as part of another component (e.g., the camera module 1180 or the communication module 1190) functionally related to the auxiliary processor 1123.

The memory 1130 may store various data used by at least one component (e.g., the processor 1120 or the sensor module 1176) of the electronic device 1101. The various data may include, for example, software (e.g., the program 1140) and input data or output data for a command related thereto. The memory 1130 may include the volatile memory 1132 or the non-volatile memory 1134.

The program 1140 may be stored in the memory 1130 as software, and may include, for example, an operating system (OS) 1142, middleware 1144, or an application 1146.

The input device 1150 may receive a command or data to be used by other component (e.g., the processor 1120) of the electronic device 1101, from the outside (e.g., a user) of the electronic device 1101. The input device 1150 may include, for example, a microphone, a mouse, a keyboard, or a digital pen (e.g., a stylus pen).

The sound output device 1155 may output sound signals to the outside of the electronic device 1101. The sound output device 1155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 1160 may visually provide information to the outside (e.g., a user) of the electronic device 1101. The display device 1160 may include, for example, a display, a hologram device, or a projector and control circuitry to control a corresponding one of the display, hologram device, and projector. According to an embodiment, the display device 1160 may include touch circuitry adapted to detect a touch, or sensor circuitry (e.g., a pressure sensor) adapted to measure the intensity of force incurred by the touch.

The audio module 1170 may convert a sound into an electrical signal and vice versa. According to an embodiment, the audio module 1170 may obtain the sound via the input device 1150, or output the sound via the sound output device 1155 or a headphone of an external electronic device (e.g., an electronic device 1102) directly (e.g., wiredly) or wirelessly coupled with the electronic device 1101.

The sensor module 1176 may detect an operational state (e.g., power or temperature) of the electronic device 1101 or an environmental state (e.g., a state of a user) external to the electronic device 1101, and then generate an electrical signal or data value corresponding to the detected state. According to an embodiment, the sensor module 1176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1177 may support one or more specified protocols to be used for the electronic device 1101 to be coupled with the external electronic device (e.g., the electronic device 1102) directly (e.g., wiredly) or wirelessly. According to an embodiment, the interface 1177 may include, for example, a high definition multimedia interface (HDMI), a universal serial bus (USB) interface, a secure digital (SD) card interface, or an audio interface.

A connecting terminal 1178 may include a connector via which the electronic device 1101 may be physically connected with the external electronic device (e.g., the electronic device 1102). According to an embodiment, the connecting terminal 1178 may include, for example, a HDMI connector, a USB connector, a SD card connector, or an audio connector (e.g., a headphone connector).

The haptic module 1179 may convert an electrical signal into a mechanical stimulus (e.g., a vibration or a movement) or electrical stimulus which may be recognized by a user via his tactile sensation or kinesthetic sensation. According to an embodiment, the haptic module 1179 may include, for example, a motor, a piezoelectric element, or an electric stimulator.

The camera module 1180 may capture a still image or moving images. According to an embodiment, the camera module 1180 may include one or more lenses, image sensors, image signal processors, or flashes.

The power management module 1188 may manage power supplied to the electronic device 1101. According to one embodiment, the power management module 1188 may be implemented as at least part of, for example, a power management integrated circuit (PMIC).

The battery 1189 may supply power to at least one component of the electronic device 1101. According to an embodiment, the battery 1189 may include, for example, a primary cell which is not rechargeable, a secondary cell which is rechargeable, or a fuel cell.

The communication module 1190 may support establishing a direct (e.g., wired) communication channel or a wireless communication channel between the electronic device 1101 and the external electronic device (e.g., the electronic device 1102, the electronic device 1104, or the server 1108) and performing communication via the established communication channel. The communication module 1190 may include one or more communication processors that are operable independently from the processor 1120 (e.g., the AP) and supports a direct (e.g., wired) communication or a wireless communication. According to an embodiment, the communication module 1190 may include a wireless communication module 1192 (e.g., a cellular communication module, a short-range wireless communication module, or a global navigation satellite system (GNSS) communication module) or a wired communication module 1194 (e.g., a local area network (LAN) communication module or a power line communication (PLC) module). A corresponding one of these communication modules may communicate with the external electronic device via the first network 1198 (e.g., a short-range communication network, such as Bluetooth™, wireless-fidelity (Wi-Fi) direct, or IrDA) or the second network 1199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1192 may identify and authenticate the electronic device 1101 in a communication network, such as the first network 1198 or the second network 1199, using subscriber information (e.g., international mobile subscriber identity (IMSI)) stored in the subscriber identification module 1196.

The antenna module 1197 may transmit or receive a signal or power to or from the outside (e.g., the external electronic device) of the electronic device 1101. According to an embodiment, the antenna module 1197 may include an antenna including a radiating element composed of a conductive material or a conductive pattern formed in or on a substrate (e.g., PCB). According to an embodiment, the antenna module 1197 may include a plurality of antennas. In such a case, at least one antenna appropriate for a communication scheme used in the communication network, such as the first network 1198 or the second network 1199, may be selected, for example, by the communication module 1190 (e.g., the wireless communication module 1192) from the plurality of antennas. The signal or the power may then be transmitted or received between the communication module 1190 and the external electronic device via the selected at least one antenna. Another component (e.g., a radio frequency integrated circuit (RFIC)) other than the radiating element may be additionally formed as part of the antenna module 1197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1101 and the external electronic device 1104 via the server 1108 coupled with the second network 1199. Each of the electronic devices 1102 and 1104 may be a device of a same type as, or a different type, from the electronic device 1101. All or some of operations to be executed at the electronic device 1101 may be executed at one or more of the external electronic devices 1102, 1104, or 1108. For example, if the electronic device 1101 should perform a function or a service automatically, or in response to a request from a user or another device, the electronic device 1101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1101. The electronic device 1101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smal tphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1140) including one or more instructions that are stored in a storage medium (e.g., internal memory 1136 or external memory 1138) that is readable by a machine (e.g., the electronic device 1101). For example, a processor (e.g., the processor 1120) of the machine (e.g., the electronic device 1101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Herein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to certain embodiments thereof, it will be understood by those skilled in the art that various changes in form and details may be made therein without departing from the scope of the disclosure. Therefore, the scope of the disclosure should not be defined as being limited to the embodiments, but should be defined by the appended claims and equivalents thereof

What is claimed is:

1. An electronic device, comprising:
    a frame structure,
    wherein the frame structure comprises:
    an outer metallic portion comprising a first metallic material and forming at least a portion of an outer surface of the electronic device;
    an inner metallic portion comprising a second metallic material different from the first metallic material and laterally surrounded by the outer metallic portion; and
    a first inner polymeric portion isolated from the inner metallic portion and at least partially laterally surrounded by the outer metallic portion, and
    wherein the electronic device comprises a wireless communication circuit electrically connected to a portion of the outer metallic portion.

2. The electronic device of claim 1, wherein the first metallic material comprises a steel use stainless (SUS), and the second metallic material comprises aluminum (Al).

3. The electronic device of claim 1, wherein the first metallic material is more rigid than the second metallic material.

4. The electronic device of claim 1, further comprising a first glass plate, and a second glass plate facing away from the first glass plate,
    wherein the first glass plate and the second glass plate are mounted or connected to the outer metallic portion.

5. The electronic device of claim 4, wherein the inner metallic portion and the first inner polymeric portion are interposed between the first glass plate and the second glass plate.

6. The electronic device of claim 4, wherein the inner metallic portion further comprises an opening.

7. The electronic device of claim 4, wherein the first inner polymeric portion comprises at least one protrusion portion that is extended outside to form a portion of the outer surface of the electronic device.

8. The electronic device of claim 4, wherein the frame structure further comprises a second inner polymeric portion that is isolated from the inner metallic portion and the first inner polymeric portion and is at least partially surrounded by the outer metallic portion, and
    wherein when viewed from above the first glass plate, the inner metallic portion is disposed between the first inner polymeric portion and the second inner polymeric portion.

9. The electronic device of claim 1, wherein the frame structure further comprises an organic layer between the outer metallic portion and the first inner polymeric portion.

10. The electronic device of claim 1, wherein the frame structure further comprises a metallic layer that comprises a third metallic material different from the first and second metallic materials and is interposed between the outer metallic portion and the inner metallic portion.

11. The electronic device of claim 10, wherein the metallic layer further comprises a material that reacts to heat or pressure generated while the inner metallic portion combined to the outer metallic portion is formed.

12. The electronic device of claim 10, wherein the metallic layer further comprises a material that does not react to heat or pressure generated while the first inner polymeric portion combined to the outer metallic portion is formed.

13. The electronic device of claim 10, wherein the metallic layer further comprises a low-melting compound, or is a plating layer.

14. The electronic device of claim 9, wherein the organic layer comprises a material that reacts to heat or pressure generated while the first inner polymeric portion combined to the outer metallic portion is formed.

15. The electronic device of claim 14, wherein the organic layer further comprises triazine thiol, dithio pyrimidine, or a silane-based compound.

16. The electronic device of claim 1, wherein an interface between the outer metallic portion and the inner metallic portion, or an interface between the outer metallic portion and the first inner polymeric portion comprises a fitting structure.

17. The electronic device of claim 1, wherein the outer metallic portion further comprises a portion that is disposed between the inner metallic portion and the first inner polymeric portion and physically isolates the inner metallic portion and the first inner polymeric portion.

18. The electronic device of claim 1, wherein the outer metallic portion further comprises a plurality of gaps and a plurality of portions physically isolated by the plurality of gaps, and
    wherein portions of the first inner polymeric portion are disposed in the gaps and form a portion of the outer surface of the electronic device.

19. The electronic device of claim 1, wherein the first inner polymeric portion comprises polyether ether ketone, polyphenylene sulfide, polybutylene terephthalate, polyimide, or polycarbonate.

20. The electronic device of claim 1, wherein the inner metallic portion is formed of a metallic material having less specific gravity than a metallic material of the outer metallic portion.

* * * * *